US010068306B2

(12) United States Patent
Rao et al.

(10) Patent No.: US 10,068,306 B2
(45) Date of Patent: Sep. 4, 2018

(54) FACILITATING DYNAMIC PIPELINING OF WORKLOAD EXECUTIONS ON GRAPHICS PROCESSING UNITS ON COMPUTING DEVICES

(71) Applicant: INTEL CORPORATION, Santa Clara, CA (US)

(72) Inventors: Jayanth N. Rao, Folsom, CA (US); Pavan K. Lanka, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/574,606

(22) Filed: Dec. 18, 2014

(65) Prior Publication Data
US 2016/0180486 A1 Jun. 23, 2016

(51) Int. Cl.
*G06F 9/50* (2006.01)
*G06T 1/20* (2006.01)
*G06F 9/46* (2006.01)
*H03K 99/00* (2013.01)

(52) U.S. Cl.
CPC .................. *G06T 1/20* (2013.01); *G06F 9/46* (2013.01); *G06F 9/5038* (2013.01); *H03K 99/00* (2013.01); *G06T 2200/28* (2013.01)

(58) Field of Classification Search
CPC ........ G06F 9/48; G06F 9/3885–9/3897; G06F 9/5038; G06F 9/5066; G06F 9/5061
See application file for complete search history.

(56) References Cited

U.S. PATENT DOCUMENTS

| 2007/0150624 A1* | 6/2007 | Moore | G06F 9/544 |
| | | | 710/5 |
| 2010/0122259 A1 | 5/2010 | Gosalia et al. | |
| 2011/0242119 A1 | 10/2011 | Bolz et al. | |
| 2011/0321051 A1* | 12/2011 | Rastogi | G06F 9/4881 |
| | | | 718/102 |
| 2012/0180068 A1* | 7/2012 | Wein | G06F 9/546 |
| | | | 718/106 |
| 2013/0162661 A1 | 6/2013 | Bolz et al. | |

(Continued)

FOREIGN PATENT DOCUMENTS

WO   WO2013/089989   6/2013

OTHER PUBLICATIONS

PCT/US2015/0569652, PCT Notification of Transmittal of The International Search Report and the Written Opinion of the International Searching Authority, or the Declaration, dated Apr. 22, 2016, 12 pages.

*Primary Examiner* — Diane Wills
(74) *Attorney, Agent, or Firm* — Womble Bond Dickinson (US) LLP

(57) ABSTRACT

A mechanism is described for facilitating dynamic pipelining of workload executions at graphics processing units on computing devices. A method of embodiments, as described herein, includes generating a command buffer having a plurality of kernels relating to a plurality of workloads to be executed at a graphics processing unit (GPU), and pipelining the workloads to be processed at the GPU, where pipelining includes scheduling each kernel to be executed on the GPU based on at least one of availability of resource threads and status of one or more dependency events relating to each kernel in relation to other kernels of the plurality of kernels.

19 Claims, 14 Drawing Sheets

(56) References Cited

U.S. PATENT DOCUMENTS

| | | | |
|---|---|---|---|
| 2014/0130056 A1* | 5/2014 | Goodman | G06F 9/5044 718/104 |
| 2014/0259016 A1* | 9/2014 | Lottes | G06F 9/4881 718/102 |
| 2015/0187040 A1 | 7/2015 | Rao et al. | |
| 2016/0093012 A1 | 3/2016 | Rao et al. | |

* cited by examiner

FACILITATING DYNAMIC PIPELINING OF WORKLOAD EXECUTIONS ON GRAPHICS PROCESSING UNITS ON COMPUTING DEVICES

FIELD

Embodiments described herein generally relate to computers. More particularly, embodiments relate to a mechanism for facilitating dynamic pipelining of workload executions at graphics processing units on computing devices.

BACKGROUND

In computing devices, graphics processing units (GPUs) excel at parallel processing because they are capable of spawning thousands of threads to process data in a parallel manner, such as using general purpose graphics processing units (GPGPUs) solving parallel data processing problems. Nevertheless, conventional techniques are not efficient in terms of conserving computing resources, such as in maximizing thread and cache utilization and such.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Figure 1:
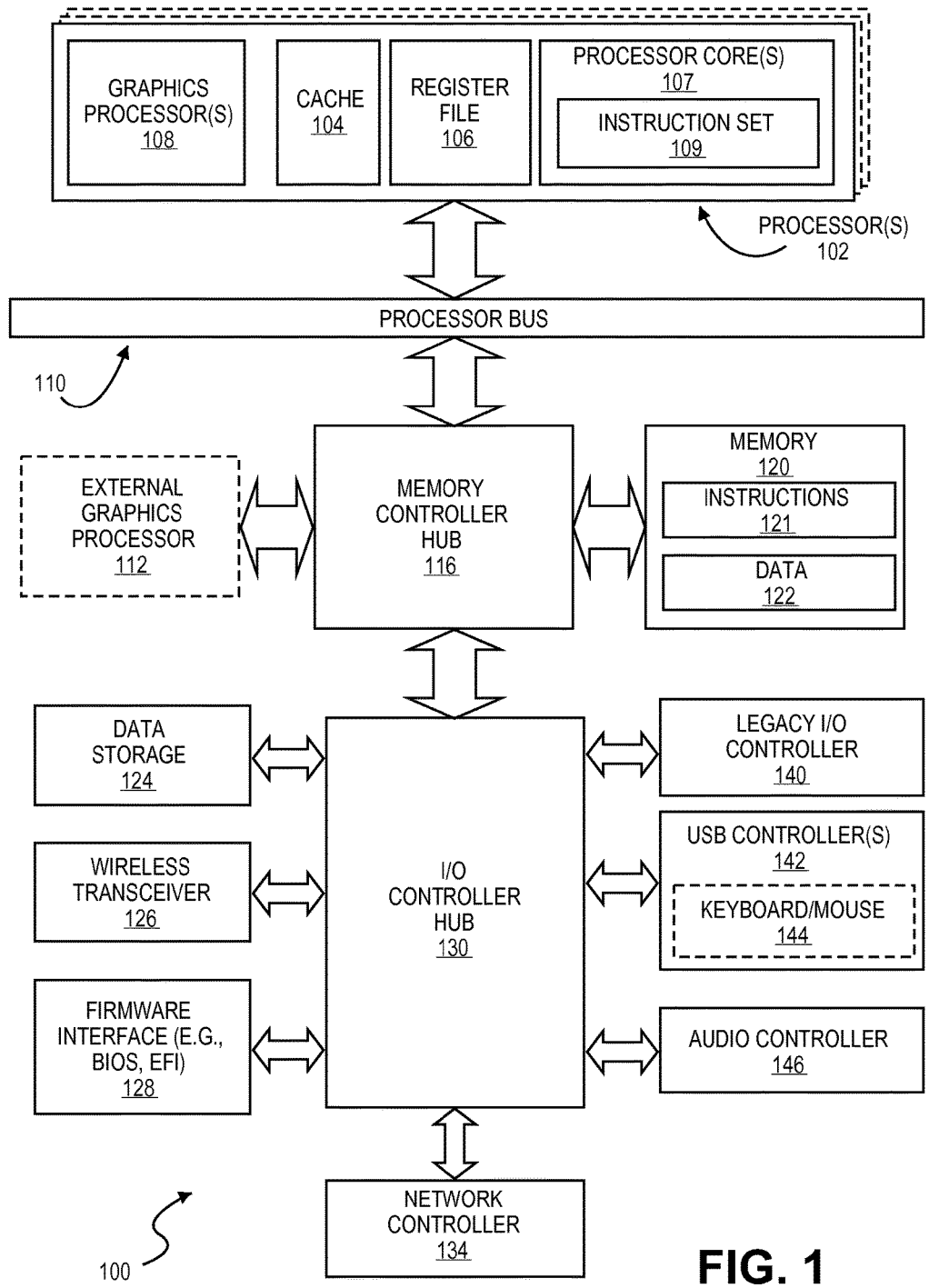
FIG. 1 is a block diagram of a data processing system, according to an embodiment.

In the following description, numerous specific details are set forth. However, embodiments, as described herein, may be practiced without these specific details. In other instances, well-known circuits, structures and techniques have not been shown in details in order not to obscure the understanding of this description.

Embodiments provide a technique for facilitating dynamic pipelining and efficient scheduling and execution of multiple GPGPU workloads for processing at GPUs. For example, a workload may be executed on a GPU by executing the associate program kernel on the GPU. In one embodiment, GPGPU workloads may be detected and scheduled in a pipeline manner which allows for execution of multiple workloads without have to stall the computing device. This way, system resources are conversed, such as maximizing thread and cache utilization, etc.

Embodiments provide for a GPU compute runtime/driver logic employing a mechanism for facilitating parallel scheduling of multiple workloads without having to require any additional hardware. Embodiments provide for a technique that is appreciably efficient in terms of time, power, and resources, etc., and further provide for a seamless and effective parallel processing path.

Moreover, embodiments take into consideration any number and type of events and/or criteria, imposed by one or more applications, that, in some implementations, may have to be satisfied first before a seamless parallel processing of workloads may be performed. For example, in some cases where GPU is the producer as well as the consumer, one or more thread may have to be completed before other consumer threads can be started. Similarly, for example, in some cases where the GPU is the producer and another device (e.g., central processing unit (CPU), etc.) is the consumer, event may need to be serialized and a serialization event may be inserted to notify the other device; and in contrast, when the other device is the producer and the GPU is the consumer, the GPU consumer may stall until the producer is ready. Further, in some implementations, for command synchronization across multiple queues or when application requests are to be satisfied, a host may need to receive a notification of the completion of workloads.

It is contemplated that, for example, open computing language (OpenCL™), such as OpenCL™ 2.0, is regarded as an industry standard application programming interface (API) for GPU-related computing and offers a new graphics paradigm of nested parallelism which allows for enqueuing of kernels without having to come back to the host. For example, in some embodiments, OpenCL™ 2.0 may be used to provide direct access and use of kernels without having to involve the CPU or employing new hardware (e.g., hardware scheduler capable of creating command packets). Further, for example and in one embodiment, an OpenCL™ software application may submit (queue) commands and then, flush the queue to submit work to the GPU. The software application may queue multiple kernels and then flush for the GPU driver to pipeline the work, where the drive implements an embodiment to pipeline the workloads as will be further described throughout this document.

It is contemplated that when referring to GPUs, a kernel may be regarded as a computer program that receives input queries from software applications and translates them into data processing instructions, such as for the CPU, and other components of a computing system.

Figure 2:
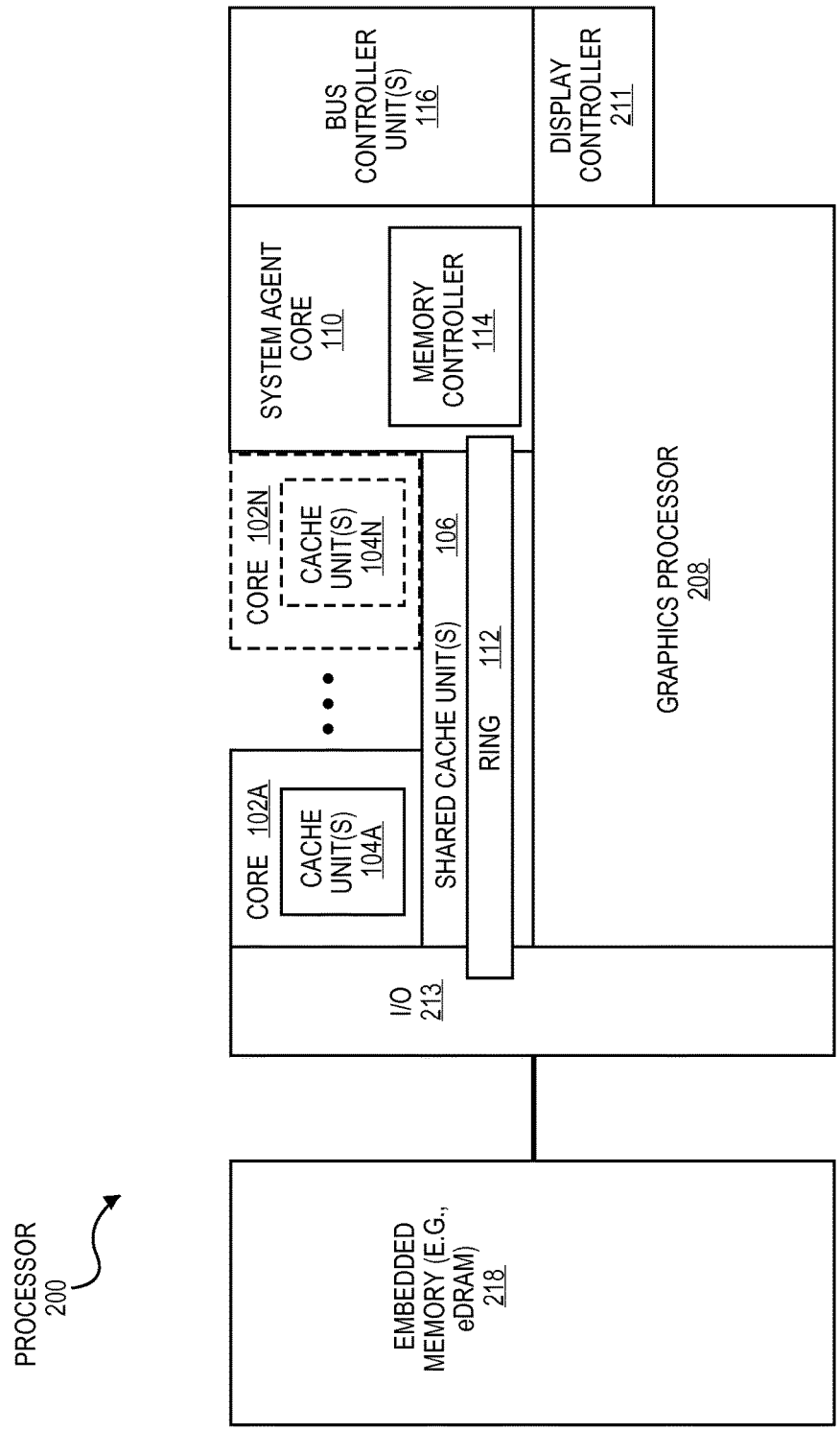
FIG. 2 is a block diagram of an embodiment of a processor having one or more processor cores, an integrated memory controller, and an integrated graphics processor.
Figure 3:
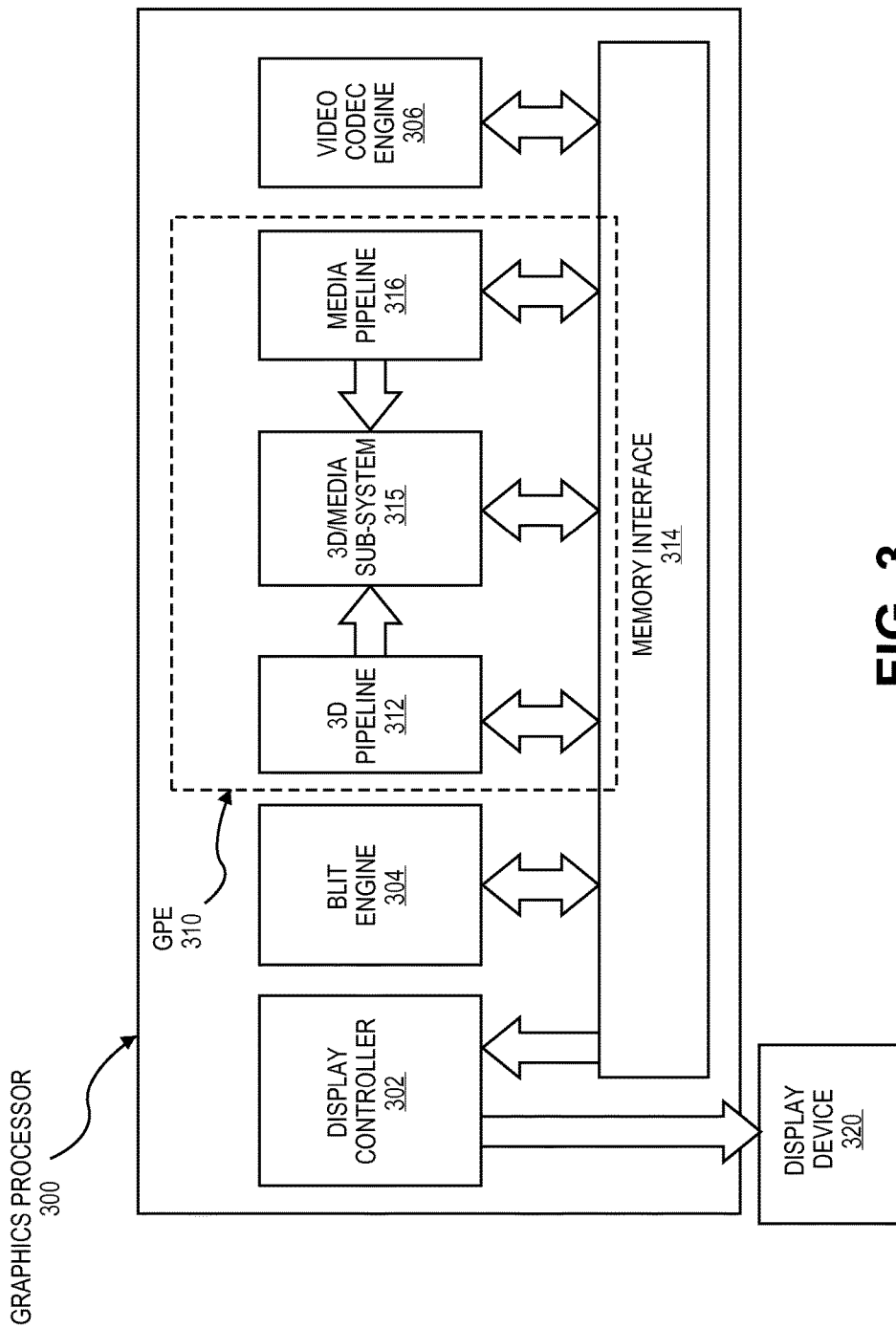
FIG. 3 is a block diagram of one embodiment of a graphics processor which may be a discreet graphics processing unit, or may be graphics processor integrated with a plurality of processing cores.

Overview—FIGS. 1-3

FIG. 1 is a block diagram of a data processing system 100, according to an embodiment. The data processing system 100 includes one or more processors 102 and one or more graphics processors 108, and may be a single processor desktop system, a multiprocessor workstation system, or a server system having a large number of processors 102 or processor cores 107. In on embodiment, the data processing system 100 is a system on a chip integrated circuit (SOC) for use in mobile, handheld, or embedded devices.

An embodiment of the data processing system 100 can include, or be incorporated within a server-based gaming platform, a game console, including a game and media console, a mobile gaming console, a handheld game console, or an online game console. In one embodiment, the data processing system 100 is a mobile phone, smart phone, tablet computing device or mobile Internet device. The data processing system 100 can also include, couple with, or be integrated within a wearable device, such as a smart watch wearable device, smart eyewear device, augmented reality device, or virtual reality device. In one embodiment, the data processing system 100 is a television or set top box device having one or more processors 102 and a graphical interface generated by one or more graphics processors 108.

The one or more processors 102 each include one or more processor cores 107 to process instructions which, when executed, perform operations for system and user software. In one embodiment, each of the one or more processor cores 107 is configured to process a specific instruction set 109. The instruction set 109 may facilitate complex instruction set computing (CISC), reduced instruction set computing (RISC), or computing via a very long instruction word (VLIW). Multiple processor cores 107 may each process a different instruction set 109 which may include instructions to facilitate the emulation of other instruction sets. A processor core 107 may also include other processing devices, such a digital signal processor (DSP).

In one embodiment, the processor 102 includes cache memory 104. Depending on the architecture, the processor 102 can have a single internal cache or multiple levels of internal cache. In one embodiment, the cache memory is shared among various components of the processor 102. In one embodiment, the processor 102 also uses an external cache (e.g., a Level 3 (L3) cache or last level cache (LLC)) (not shown) which may be shared among the processor cores 107 using known cache coherency techniques. A register file 106 is additionally included in the processor 102 which may include different types of registers for storing different types of data (e.g., integer registers, floating point registers, status registers, and an instruction pointer register). Some registers may be general-purpose registers, while other registers may be specific to the design of the processor 102.

The processor 102 is coupled to a processor bus 110 to transmit data signals between the processor 102 and other components in the system 100. The system 100 uses an exemplary 'hub' system architecture, including a memory controller hub 116 and an input output (I/O) controller hub 130. The memory controller hub 116 facilitates communication between a memory device and other components of the system 100, while the I/O controller hub (ICH) 130 provides connections to I/O devices via a local I/O bus.

The memory device 120, can be a dynamic random access memory (DRAM) device, a static random access memory (SRAM) device, flash memory device, or some other memory device having suitable performance to serve as process memory. The memory 120 can store data 122 and instructions 121 for use when the processor 102 executes a process. The memory controller hub 116 also couples with an optional external graphics processor 112, which may communicate with the one or more graphics processors 108 in the processors 102 to perform graphics and media operations.

The ICH 130 enables peripherals to connect to the memory 120 and processor 102 via a high-speed I/O bus. The I/O peripherals include an audio controller 146, a firmware interface 128, a wireless transceiver 126 (e.g., Wi-Fi, Bluetooth), a data storage device 124 (e.g., hard disk drive, flash memory, etc.), and a legacy I/O controller for coupling legacy (e.g., Personal System 2 (PS/2)) devices to the system. One or more Universal Serial Bus (USB) controllers 142 connect input devices, such as keyboard and mouse 144 combinations. A network controller 134 may also couple to the ICH 130. In one embodiment, a high-performance network controller (not shown) couples to the processor bus 110.

FIG. 2 is a block diagram of an embodiment of a processor 200 having one or more processor cores 102A-N, an integrated memory controller 114, and an integrated graphics processor 208. The processor 200 can include additional cores up to and including additional core 102N represented by the dashed lined boxes. Each of the cores 102A-N includes one or more internal cache unit(s) 104A-N. In one embodiment each core also has access to one or more shared cached unit(s) 106.

The internal cache unit(s) 104A-N and shared cache unit(s) 106 represent a cache memory hierarchy within the processor 200. The cache memory hierarchy may include at least one level of instruction and data cache within each core and one or more levels of shared mid-level cache, such as a level 2 (L2), level 3 (L3), level 4 (L4), or other levels of cache, where the highest level of cache before external memory is classified as the last level cache (LLC). In one embodiment, cache coherency logic maintains coherency between the various cache units 106 and 104A-N.

The processor 200 may also include a set of one or more bus controller units 116 and a system agent 110. The one or more bus controller units manage a set of peripheral buses, such as one or more Peripheral Component Interconnect buses (e.g., PCI, PCI Express). The system agent 110 provides management functionality for the various processor components. In one embodiment, the system agent 110 includes one or more integrated memory controllers 114 to manage access to various external memory devices (not shown).

In one embodiment, one or more of the cores 102A-N include support for simultaneous multi-threading. In such embodiment, the system agent 110 includes components for coordinating and operating cores 102A-N during multi-threaded processing. The system agent 110 may additionally include a power control unit (PCU), which includes logic and components to regulate the power state of the cores 102A-N and the graphics processor 208.

The processor 200 additionally includes a graphics processor 208 to execute graphics processing operations. In one embodiment, the graphics processor 208 couples with the set of shared cache unit(s) 106, and the system agent unit 110, including the one or more integrated memory controllers 114. In one embodiment, a display controller 211 is coupled with the graphics processor 208 to drive graphics processor output to one or more coupled displays. The display controller 211 may be separate module coupled with the graphics processor via at least one interconnect, or may be integrated within the graphics processor 208 or system agent 110.

In one embodiment a ring based interconnect unit 112 is used to couple the internal components of the processor 200, however an alternative interconnect unit may be used, such as a point to point interconnect, a switched interconnect, or other techniques, including techniques well known in the art. In one embodiment, the graphics processor 208 couples with the ring interconnect 112 via an I/O link 213.

The exemplary I/O link 213 represents at least one of multiple varieties of I/O interconnects, including an on package I/O interconnect which facilitates communication between various processor components and a high-performance embedded memory module 218, such as an eDRAM module. In one embodiment each of the cores 102-N and the graphics processor 208 use the embedded memory modules 218 as shared last level cache.

In one embodiment cores 102A-N are homogenous cores executing the same instruction set architecture. In another embodiment, the cores 102A-N are heterogeneous in terms of instruction set architecture (ISA), where one or more of the cores 102A-N execute a first instruction set, while at least one of the other cores executes a subset of the first instruction set or a different instruction set.

The processor 200 can be a part of or implemented on one or more substrates using any of a number of process technologies, for example, Complementary metal-oxide-semiconductor (CMOS), Bipolar Junction/Complementary metal-oxide-semiconductor (BiCMOS) or N-type metal-oxide-semiconductor logic (NMOS). Additionally, the processor 200 can be implemented on one or more chips or as a system on a chip (SOC) integrated circuit having the illustrated components, in addition to other components.

FIG. 3 is a block diagram of one embodiment of a graphics processor 300 which may be a discreet graphics processing unit, or may be graphics processor integrated with a plurality of processing cores. In one embodiment, the graphics processor is communicated with via a memory mapped I/O interface to registers on the graphics processor and via commands placed into the processor memory. The graphics processor 300 includes a memory interface 314 to access memory. The memory interface 314 can be an interface to local memory, one or more internal caches, one or more shared external caches, and/or to system memory.

The graphics processor 300 also includes a display controller 302 to drive display output data to a display device 320. The display controller 302 includes hardware for one or more overlay planes for the display and composition of multiple layers of video or user interface elements. In one embodiment the graphics processor 300 includes a video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In one embodiment, the graphics processor 300 includes a block image transfer (BLIT) engine 304 to perform two-dimensional (2D) rasterizer operations including, for example, bit-boundary block transfers. However, in one embodiment, 2D graphics operations are performed using one or more components of the graphics-processing engine (GPE) 310. The graphics-processing engine 310 is a compute engine for performing graphics operations, including three-dimensional (3D) graphics operations and media operations.

The GPE 310 includes a 3D pipeline 312 for performing 3D operations, such as rendering three-dimensional images and scenes using processing functions that act upon 3D primitive shapes (e.g., rectangle, triangle, etc.). The 3D pipeline 312 includes programmable and fixed function elements that perform various tasks within the element and/or spawn execution threads to a 3D/Media sub-system 315. While the 3D pipeline 312 can be used to perform media operations, an embodiment of the GPE 310 also includes a media pipeline 316 that is specifically used to perform media operations, such as video post processing and image enhancement.

In one embodiment, the media pipeline 316 includes fixed function or programmable logic units to perform one or more specialized media operations, such as video decode acceleration, video de-interlacing, and video encode acceleration in place of, or on behalf of the video codec engine 306. In on embodiment, the media pipeline 316 additionally includes a thread spawning unit to spawn threads for execution on the 3D/Media sub-system 315. The spawned threads perform computations for the media operations on one or more graphics execution units included in the 3D/Media sub-system.

The 3D/Media subsystem 315 includes logic for executing threads spawned by the 3D pipeline 312 and media pipeline 316. In one embodiment, the pipelines send thread execution requests to the 3D/Media subsystem 315, which includes thread dispatch logic for arbitrating and dispatching the various requests to available thread execution resources. The execution resources include an array of graphics execution units to process the 3D and media threads. In one embodiment, the 3D/Media subsystem 315 includes one or more internal caches for thread instructions and data. In one embodiment, the subsystem also includes shared memory, including registers and addressable memory, to share data between threads and to store output data.

Figure 4:
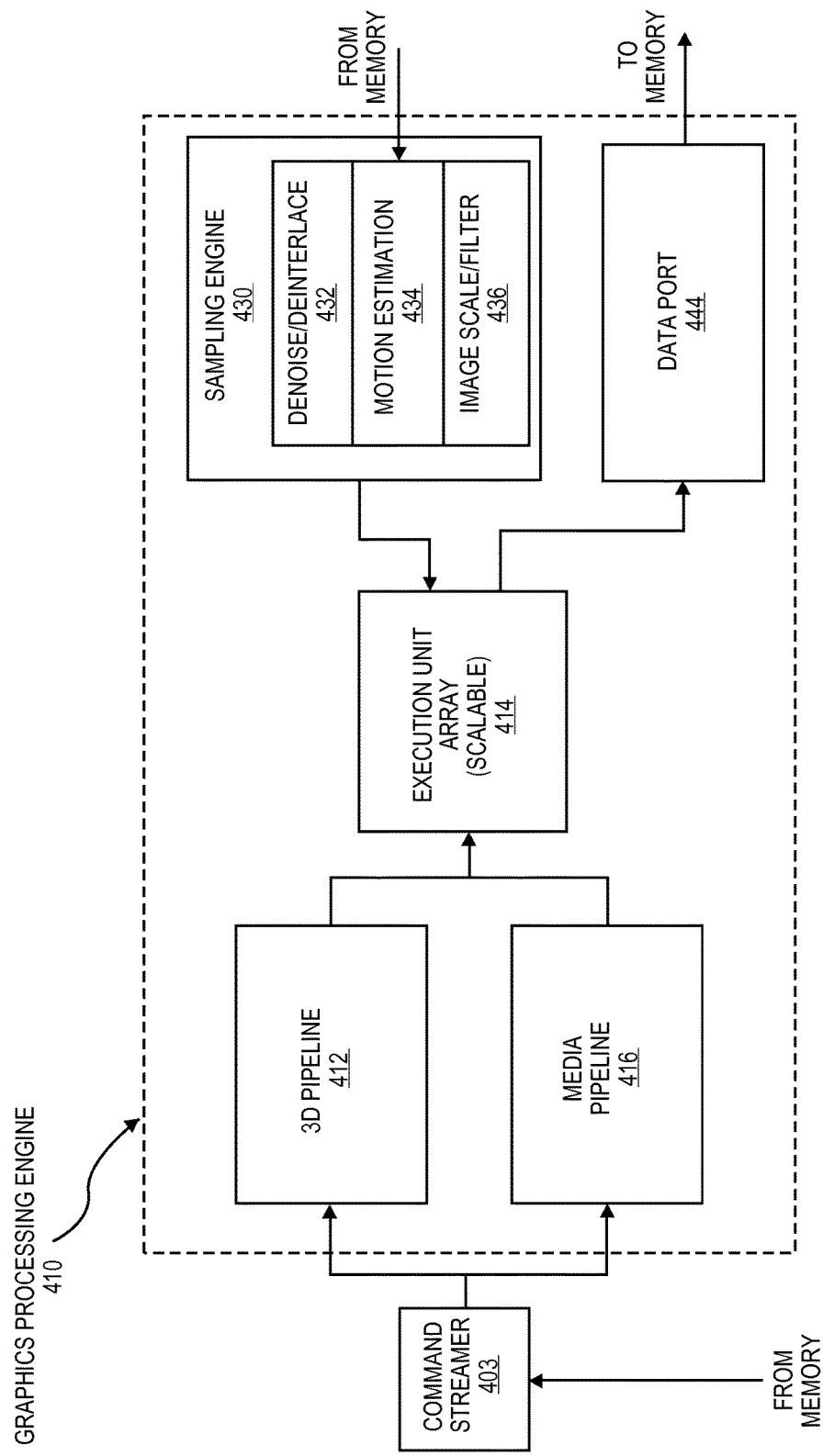
FIG. 4 is a block diagram of an embodiment of a graphics processing engine for a graphics processor.

3D/Media Processing—FIG. 4

FIG. 4 is a block diagram of an embodiment of a graphics processing engine 410 for a graphics processor. In one embodiment, the graphics processing engine (GPE) 410 is a version of the GPE 310 shown in FIG. 3. The GPE 410 includes a 3D pipeline 412 and a media pipeline 416, each of which can be either different from or similar to the implementations of the 3D pipeline 312 and the media pipeline 316 of FIG. 3.

In one embodiment, the GPE 410 couples with a command streamer 403, which provides a command stream to the GPE 3D and media pipelines 412, 416. The command streamer 403 is coupled to memory, which can be system memory, or one or more of internal cache memory and shared cache memory. The command streamer 403 receives commands from the memory and sends the commands to the 3D pipeline 412 and/or media pipeline 416. The 3D and media pipelines process the commands by performing operations via logic within the respective pipelines or by dispatching one or more execution threads to the execution unit array 414. In one embodiment, the execution unit array 414 is scalable, such that the array includes a variable number of execution units based on the target power and performance level of the GPE 410.

A sampling engine 430 couples with memory (e.g., cache memory or system memory) and the execution unit array 414. In one embodiment, the sampling engine 430 provides a memory access mechanism for the scalable execution unit array 414 that allows the execution array 414 to read graphics and media data from memory. In one embodiment, the sampling engine 430 includes logic to perform specialized image sampling operations for media.

The specialized media sampling logic in the sampling engine 430 includes a de-noise/de-interlace module 432, a motion estimation module 434, and an image scaling and filtering module 436. The de-noise/de-interlace module 432 includes logic to perform one or more of a de-noise or a de-interlace algorithm on decoded video data. The de-interlace logic combines alternating fields of interlaced video content into a single fame of video. The de-noise logic reduces or remove data noise from video and image data. In one embodiment, the de-noise logic and de-interlace logic are motion adaptive and use spatial or temporal filtering based on the amount of motion detected in the video data. In one embodiment, the de-noise/de-interlace module 432 includes dedicated motion detection logic (e.g., within the motion estimation engine 434).

The motion estimation engine 434 provides hardware acceleration for video operations by performing video acceleration functions such as motion vector estimation and prediction on video data. The motion estimation engine determines motion vectors that describe the transformation of image data between successive video frames. In one embodiment, a graphics processor media codec uses the video motion estimation engine 434 to perform operations on video at the macro-block level that may otherwise be computationally intensive to perform using a general-purpose processor. In one embodiment, the motion estimation engine 434 is generally available to graphics processor components to assist with video decode and processing functions that are sensitive or adaptive to the direction or magnitude of the motion within video data.

The image scaling and filtering module 436 performs image-processing operations to enhance the visual quality of generated images and video. In one embodiment, the scaling and filtering module 436 processes image and video data during the sampling operation before providing the data to the execution unit array 414.

In one embodiment, the graphics processing engine 410 includes a data port 444, which provides an additional mechanism for graphics subsystems to access memory. The data port 444 facilitates memory access for operations including render target writes, constant buffer reads, scratch memory space reads/writes, and media surface accesses. In one embodiment, the data port 444 includes cache memory space to cache accesses to memory. The cache memory can be a single data cache or separated into multiple caches for the multiple subsystems that access memory via the data port (e.g., a render buffer cache, a constant buffer cache, etc.). In one embodiment, threads executing on an execution unit in the execution unit array 414 communicate with the data port by exchanging messages via a data distribution interconnect that couples each of the sub-systems of the graphics processing engine 410.

Figure 5:
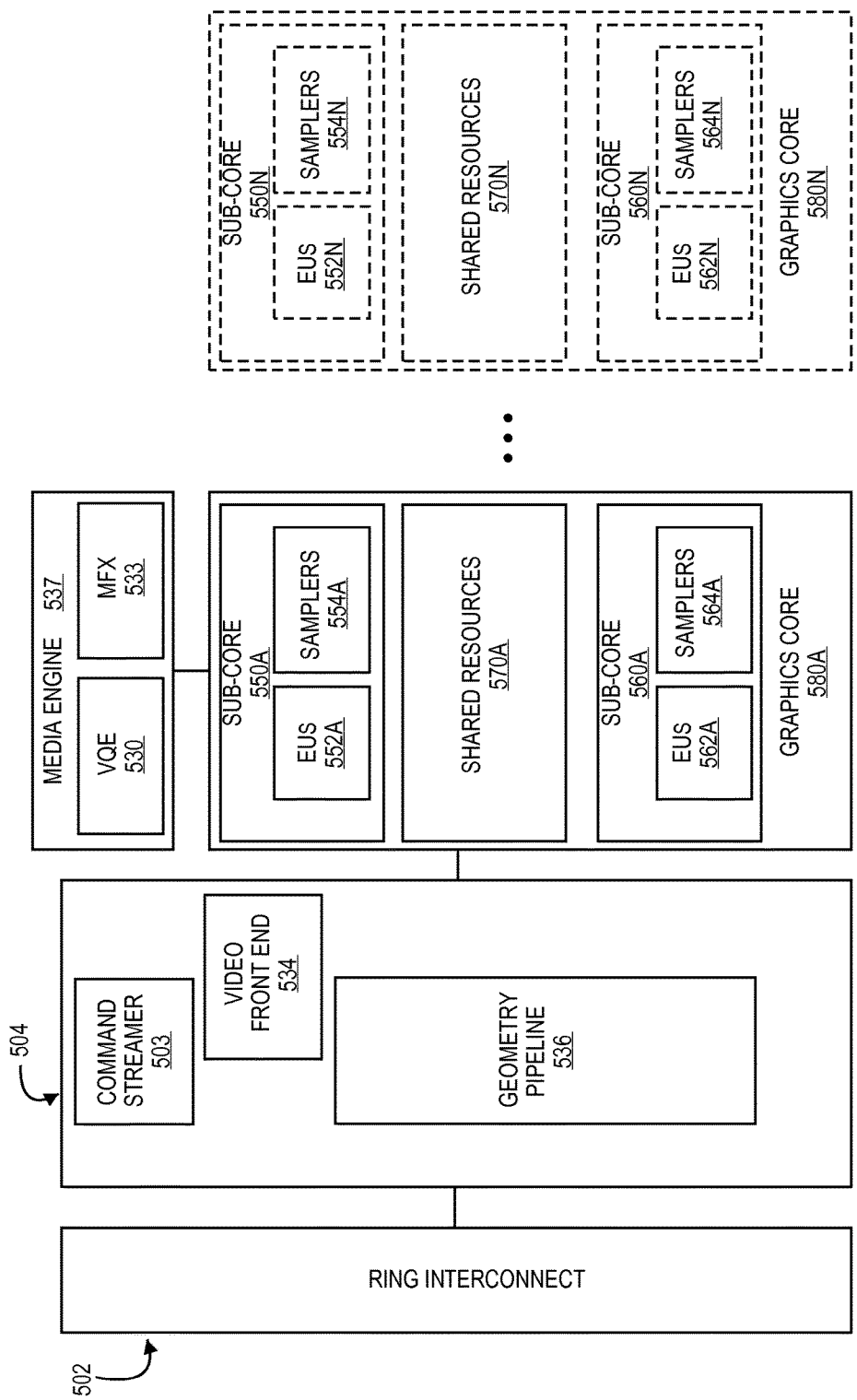
FIG. 5 is a block diagram of another embodiment of a graphics processor.
Figure 6:
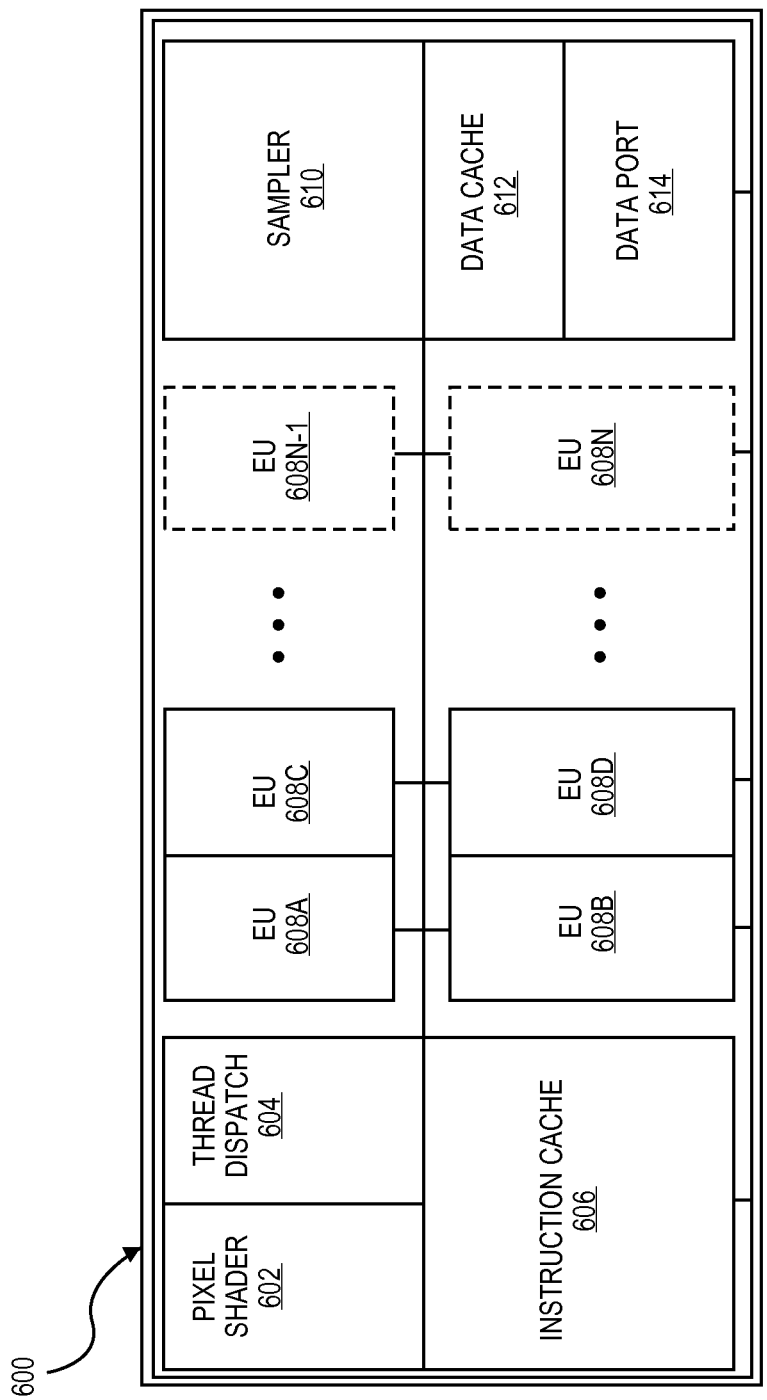
FIG. 6 illustrates thread execution logic including an array of processing elements employed in one embodiment of a graphics processing engine.
Figure 7:
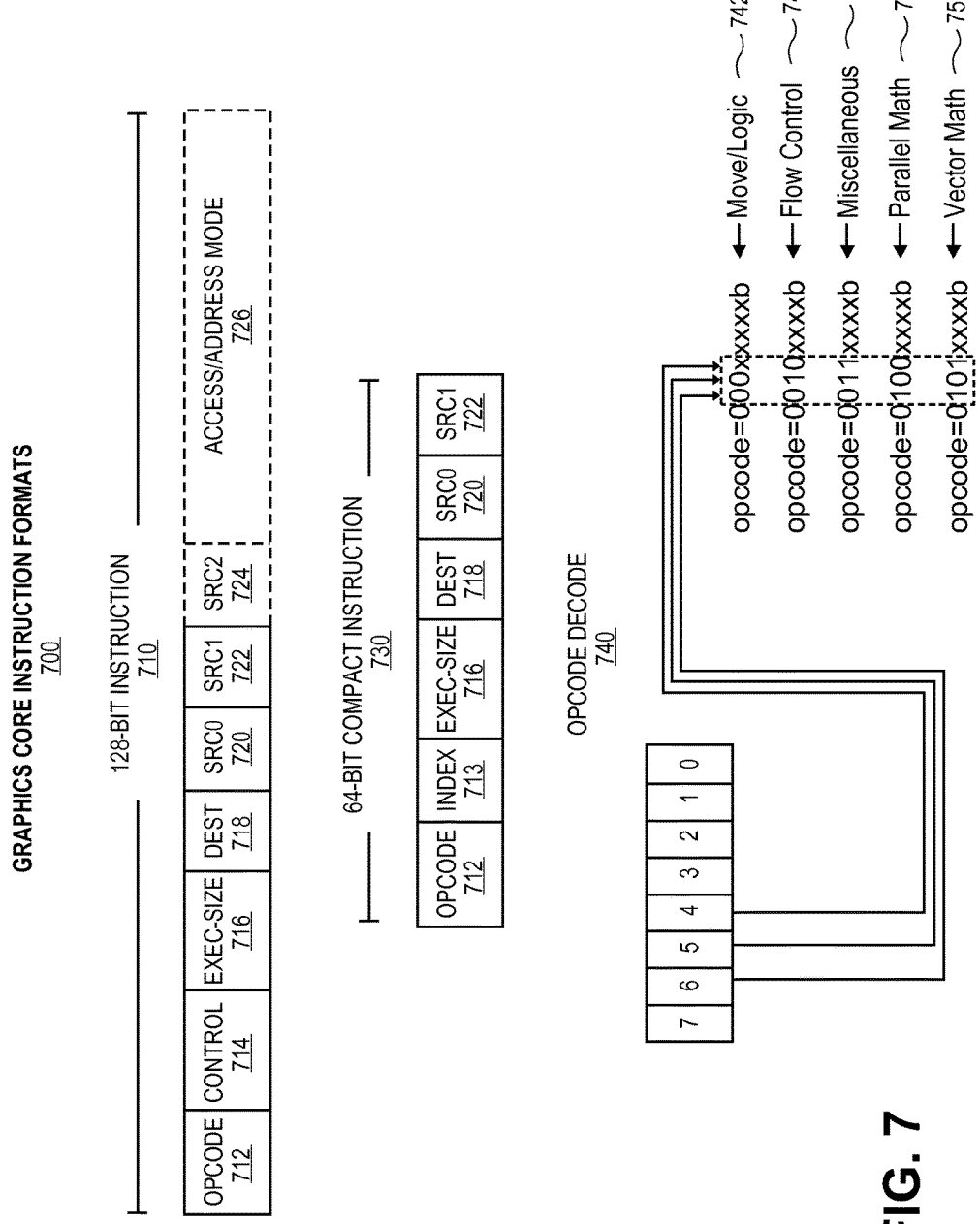
FIG. 7 is a block diagram illustrating a graphics processor execution unit instruction format according to an embodiment.

Execution Units—FIGS. 5-7

FIG. 5 is a block diagram of another embodiment of a graphics processor. In one embodiment, the graphics processor includes a ring interconnect 502, a pipeline front-end 504, a media engine 537, and graphics cores 580A-N. The ring interconnect 502 couples the graphics processor to other processing units, including other graphics processors or one or more general-purpose processor cores. In one embodiment, the graphics processor is one of many processors integrated within a multi-core processing system.

The graphics processor receives batches of commands via the ring interconnect 502. The incoming commands are interpreted by a command streamer 503 in the pipeline front-end 504. The graphics processor includes scalable execution logic to perform 3D geometry processing and media processing via the graphics core(s) 580A-N. For 3D geometry processing commands, the command streamer 503 supplies the commands to the geometry pipeline 536. For at least some media processing commands, the command streamer 503 supplies the commands to a video front end 534, which couples with a media engine 537. The media engine 537 includes a video quality engine (VQE) 530 for video and image post processing and a multi-format encode/decode (MFX) 533 engine to provide hardware-accelerated media data encode and decode. The geometry pipeline 536 and media engine 537 each generate execution threads for the thread execution resources provided by at least one graphics core 580A.

The graphics processor includes scalable thread execution resources featuring modular cores 580A-N (sometime referred to as core slices), each having multiple sub-cores 550A-N, 560A-N (sometimes referred to as core sub-slices). The graphics processor can have any number of graphics cores 580A through 580N. In one embodiment, the graphics processor includes a graphics core 580A having at least a first sub-core 550A and a second core sub-core 560A. In another embodiment, the graphics processor is a low power processor with a single sub-core (e.g., 550A). In one embodiment, the graphics processor includes multiple graphics cores 580A-N, each including a set of first sub-cores 550A-N and a set of second sub-cores 560A-N. Each sub-core in the set of first sub-cores 550A-N includes at least a first set of execution units 552A-N and media/texture samplers 554A-N. Each sub-core in the set of second sub-cores 560A-N includes at least a second set of execution units 562A-N and samplers 564A-N. In one embodiment, each sub-core 550A-N, 560A-N shares a set of shared resources 570A-N. In one embodiment, the shared resources include shared cache memory and pixel operation logic. Other shared resources may also be included in the various embodiments of the graphics processor.

FIG. 6 illustrates thread execution logic 600 including an array of processing elements employed in one embodiment of a graphics processing engine. In one embodiment, the thread execution logic 600 includes a pixel shader 602, a thread dispatcher 604, instruction cache 606, a scalable execution unit array including a plurality of execution units 608A-N, a sampler 610, a data cache 612, and a data port 614. In one embodiment the included components are interconnected via an interconnect fabric that links to each of the components. The thread execution logic 600 includes one or more connections to memory, such as system memory or cache memory, through one or more of the instruction cache 606, the data port 614, the sampler 610, and the execution unit array 608A-N. In one embodiment, each execution unit (e.g. 608A) is an individual vector processor capable of executing multiple simultaneous threads and processing multiple data elements in parallel for each thread. The execution unit array 608A-N includes any number individual execution units.

In one embodiment, the execution unit array 608A-N is primarily used to execute "shader" programs. In one embodiment, the execution units in the array 608A-N execute an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders).

Each execution unit in the execution unit array 608A-N operates on arrays of data elements. The number of data elements is the "execution size," or the number of channels for the instruction. An execution channel is a logical unit of execution for data element access, masking, and flow control within instructions. The number of channels may be independent of the number of physical ALUs or FPUs for a particular graphics processor. The execution units 608A-N support integer and floating-point data types.

The execution unit instruction set includes single instruction multiple data (SIVID) instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (quad-word (QW) size data elements), eight separate 32-bit packed data elements (double word (DW) size data elements), sixteen separate 16-bit packed data elements (word (W) size data elements), or thirty-two separate 8-bit data elements (byte (B) size data elements). However, different vector widths and register sizes are possible.

One or more internal instruction caches (e.g., 606) are included in the thread execution logic 600 to cache thread instructions for the execution units. In one embodiment, one or more data caches (e.g., 612) are included to cache thread data during thread execution. A sampler 610 is included to provide texture sampling for 3D operations and media sampling for media operations. In one embodiment, the sampler 610 includes specialized texture or media sampling functionality to process texture or media data during the sampling process before providing the sampled data to an execution unit.

During execution, the graphics and media pipelines send thread initiation requests to the thread execution logic 600 via thread spawning and dispatch logic. The thread execution logic 600 includes a local thread dispatcher 604 that arbitrates thread initiation requests from the graphics and media pipelines and instantiates the requested threads on one or more execution units 608A-N. For example, the geometry pipeline (e.g., 536 of FIG. 5) dispatches vertex processing, tessellation, or geometry processing threads to the thread execution logic 600. The thread dispatcher 604 can also process runtime thread spawning requests from the executing shader programs.

Once a group of geometric objects have been processed and rasterized into pixel data, the pixel shader 602 is invoked to further compute output information and cause results to be written to output surfaces (e.g., color buffers, depth buffers, stencil buffers, etc.). In one embodiment, the pixel shader 602 calculates the values of the various vertex attributes that are to be interpolated across the rasterized object. The pixel shader 602 then executes an API-supplied pixel shader program. To execute the pixel shader program, the pixel shader 602 dispatches threads to an execution unit (e.g., 608A) via the thread dispatcher 604. The pixel shader 602 uses texture sampling logic in the sampler 610 to access texture data in texture maps stored in memory. Arithmetic operations on the texture data and the input geometry data compute pixel color data for each geometric fragment, or discards one or more pixels from further processing.

In one embodiment, the data port 614 provides a memory access mechanism for the thread execution logic 600 output processed data to memory for processing on a graphics processor output pipeline. In one embodiment, the data port 614 includes or couples to one or more cache memories (e.g., data cache 612) to cache data for memory access via the data port.

FIG. 7 is a block diagram illustrating a graphics processor execution unit instruction format according to an embodiment. In one embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. The instruction format described an illustrated are macro-instructions, in that they are instructions supplied to the execution unit, as opposed to micro-operations resulting from instruction decode once the instruction is processed.

In one embodiment, the graphics processor execution units natively support instructions in a 128-bit format 710. A 64-bit compacted instruction format 730 is available for some instructions based on the selected instruction, instruction options, and number of operands. The native 128-bit format 710 provides access to all instruction options, while some options and operations are restricted in the 64-bit format 730. The native instructions available in the 64-bit format 730 varies by embodiment. In one embodiment, the instruction is compacted in part using a set of index values in an index field 713. The execution unit hardware references a set of compaction tables based on the index values and uses the compaction table outputs to reconstruct a native instruction in the 128-bit format 710.

For each format, an instruction opcode 712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. An instruction control field 712 enables control over certain execution options, such as channels selection (e.g., predication) and data channel order (e.g., swizzle). For 128-bit instructions 710 an exec-size field 716 limits the number of data channels that will be executed in parallel. The exec-size field 716 is not available for use in the 64-bit compact instruction format 730.

Some execution unit instructions have up to three operands including two source operands, src0 722, src1 722, and one destination 718. In one embodiment, the execution units support dual destination instructions, where one of the destinations is implied. Data manipulation instructions can have a third source operand (e.g., SRC2 724), where the instruction opcode JJ12 determines the number of source operands. An instruction's last source operand can be an immediate (e.g., hard-coded) value passed with the instruction.

In one embodiment instructions are grouped based on opcode bit-fields to simplify Opcode decode 740. For an 8-bit opcode, bits 4, 5, and 6 allow the execution unit to determine the type of opcode. The precise opcode grouping shown is exemplary. In one embodiment, a move and logic opcode group 742 includes data movement and logic instructions (e.g., mov, cmp). The move and logic group 742 shares the five most significant bits (MSB), where move instructions are in the form of 0000xxxxb (e.g., 0x0x) and logic instructions are in the form of 0001xxxxb (e.g., 0x01). A flow control instruction group 744 (e.g., call, jmp) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, mul) in the form of 0100xxxxb (e.g., 0x40). The parallel math group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands.

Figure 8:
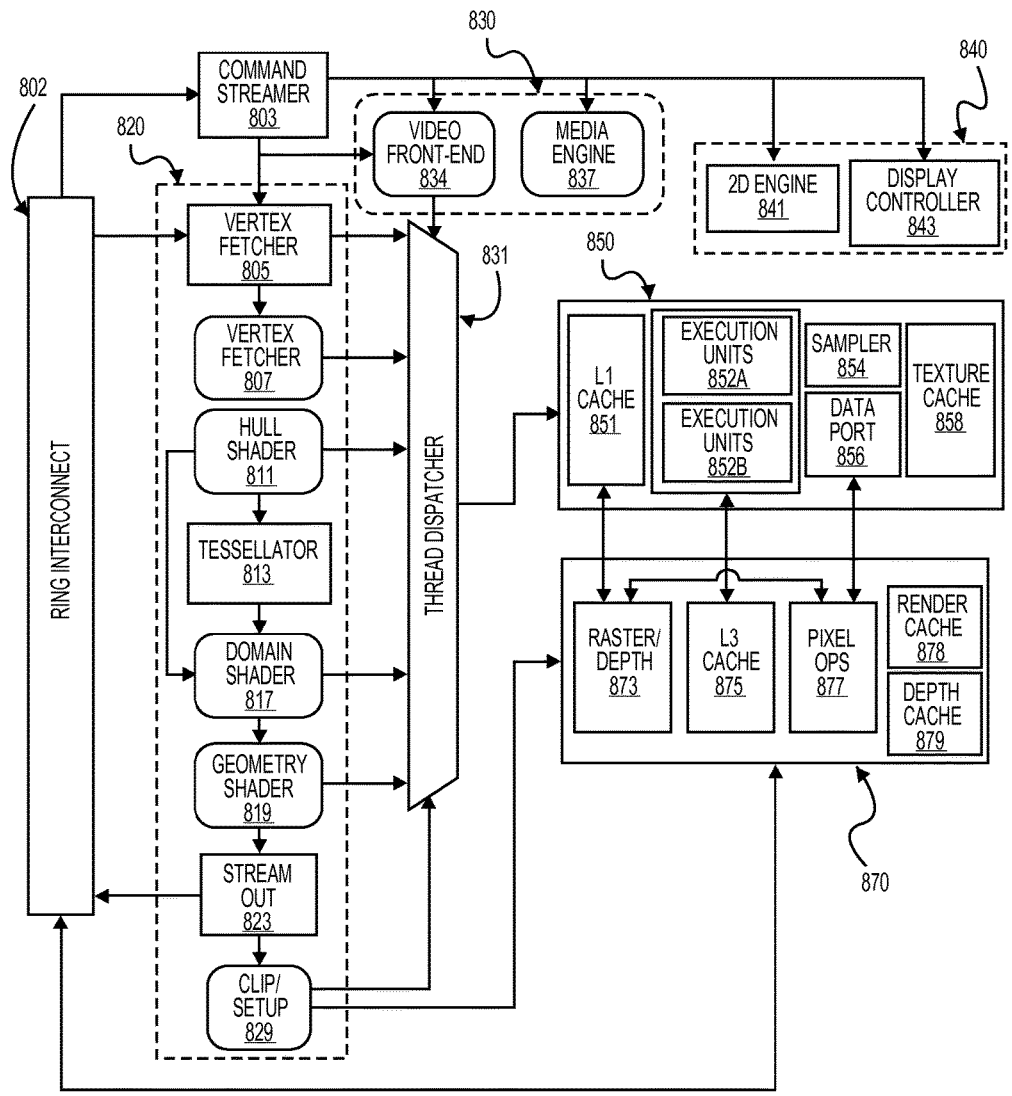
FIG. 8 is a block diagram of another embodiment of a graphics processor which includes a graphics pipeline, a media pipeline, a display engine, thread execution logic, and a render output pipeline.

Graphics Pipeline—FIG. 8

FIG. 8 is a block diagram of another embodiment of a graphics processor which includes a graphics pipeline 820, a media pipeline 830, a display engine 840, thread execution logic 850, and a render output pipeline 870. In one embodiment, the graphics processor is a graphics processor within a multi-core processing system that includes one or more general purpose processing cores. The graphics processor is controlled by register writes to one or more control registers (not shown) or via commands issued to the graphics processor via a ring interconnect 802. The ring interconnect 802 couples the graphics processor to other processing components, such as other graphics processors or general-purpose processors. Commands from the ring interconnect are interpreted by a command streamer 803 which supplies instructions to individual components of the graphics pipeline 820 or media pipeline 830.

The command streamer 803 directs the operation of a vertex fetcher 805 component that reads vertex data from memory and executes vertex-processing commands provided by the command streamer 803. The vertex fetcher 805 provides vertex data to a vertex shader 807, which performs coordinate space transformation and lighting operations to each vertex. The vertex fetcher 805 and vertex shader 807 execute vertex-processing instructions by dispatching execution threads to the execution units 852A, 852B via a thread dispatcher 831.

In one embodiment, the execution units 852A, 852B are an array of vector processors having an instruction set for performing graphics and media operations. The execution units 852A, 852B have an attached L1 cache 851 that is specific for each array or shared between the arrays. The cache can be configured as a data cache, an instruction cache, or a single cache that is partitioned to contain data and instructions in different partitions.

In one embodiment, the graphics pipeline 820 includes tessellation components to perform hardware-accelerated tessellation of 3D objects. A programmable hull shader 811 configures the tessellation operations. A programmable domain shader 817 provides back-end evaluation of tessellation output. A tessellator 813 operates at the direction of the hull shader 811 and contains special purpose logic to generate a set of detailed geometric objects based on a coarse geometric model that is provided as input to the graphics pipeline 820. If tessellation is not used, the tessellation components 811, 813, 817 can be bypassed.

The complete geometric objects can be processed by a geometry shader 819 via one or more threads dispatched to the execution units 852A, 852B, or can proceed directly to the clipper 829. The geometry shader operates on entire geometric objects, rather than vertices or patches of vertices as in previous stages of the graphics pipeline. If the tessellation is disabled the geometry shader 819 receives input from the vertex shader 807. The geometry shader 819 is programmable by a geometry shader program to perform geometry tessellation if the tessellation units are disabled.

Prior to rasterization, vertex data is processed by a clipper 829, which is either a fixed function clipper or a programmable clipper having clipping and geometry shader functions. In one embodiment, a rasterizer 873 in the render output pipeline 870 dispatches pixel shaders to convert the geometric objects into their per pixel representations. In one embodiment, pixel shader logic is included in the thread execution logic 850.

The graphics engine has an interconnect bus, interconnect fabric, or some other interconnect mechanism that allows data and message passing amongst the major components of the graphics engine. In one embodiment the execution units 852A, 852B and associated cache(s) 851, texture and media sampler 854, and texture/sampler cache 858 interconnect via a data port 856 to perform memory access and communicate with render output pipeline components of the graphics engine. In one embodiment, the sampler 854, caches 851, 858 and execution units 852A, 852B each have separate memory access paths.

In one embodiment, the render output pipeline 870 contains a rasterizer and depth test component 873 that converts vertex-based objects into their associated pixel-based representation. In one embodiment, the rasterizer logic includes a windower/masker unit to perform fixed function triangle and line rasterization. An associated render and depth buffer caches 878, 879 are also available in one embodiment. A pixel operations component 877 performs pixel-based operations on the data, though in some instances, pixel operations associated with 2D operations (e.g. bit block image transfers with blending) are performed by the 2D engine 841, or substituted at display time by the display controller 843 using overlay display planes. In one embodiment a shared L3 cache 875 is available to all graphics components, allowing the sharing of data without the use of main system memory.

The graphics processor media pipeline 830 includes a media engine 337 and a video front end 834. In one embodiment, the video front end 834 receives pipeline commands from the command streamer 803. However, in one embodiment the media pipeline 830 includes a separate command streamer. The video front-end 834 processes media commands before sending the command to the media engine 837. In one embodiment, the media engine includes thread spawning functionality to spawn threads for dispatch to the thread execution logic 850 via the thread dispatcher 831.

In one embodiment, the graphics engine includes a display engine 840. In one embodiment, the display engine 840 is external to the graphics processor and couples with the graphics processor via the ring interconnect 802, or some other interconnect bus or fabric. The display engine 840 includes a 2D engine 841 and a display controller 843. The display engine 840 contains special purpose logic capable of operating independently of the 3D pipeline. The display controller 843 couples with a display device (not shown), which may be a system integrated display device, as in a laptop computer, or an external display device attached via an display device connector.

The graphics pipeline 820 and media pipeline 830 are configurable to perform operations based on multiple graphics and media programming interfaces and are not specific to any one application programming interface (API). In one embodiment, driver software for the graphics processor translates API calls that are specific to a particular graphics or media library into commands that can be processed by the graphics processor. In various embodiments, support is provided for the Open Graphics Library (OpenGL) and Open Computing Language (OpenCL™) supported by the Khronos Group, the Direct3D library from the Microsoft Corporation, or, in one embodiment, both OpenGL and D3D. Support may also be provided for the Open Source Computer Vision Library (OpenCV). A future API with a compatible 3D pipeline would also be supported if a mapping can be made from the pipeline of the future API to the pipeline of the graphics processor.

Figure 9A:
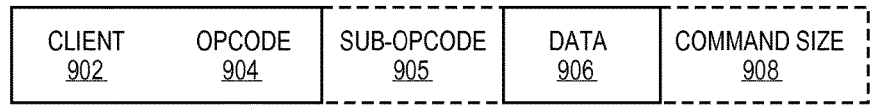
FIG. 9A is a block diagram illustrating a graphics processor command format according to an embodiment and FIG. 9B is a block diagram illustrating a graphics processor command sequence according to an embodiment.
Figure 9B:
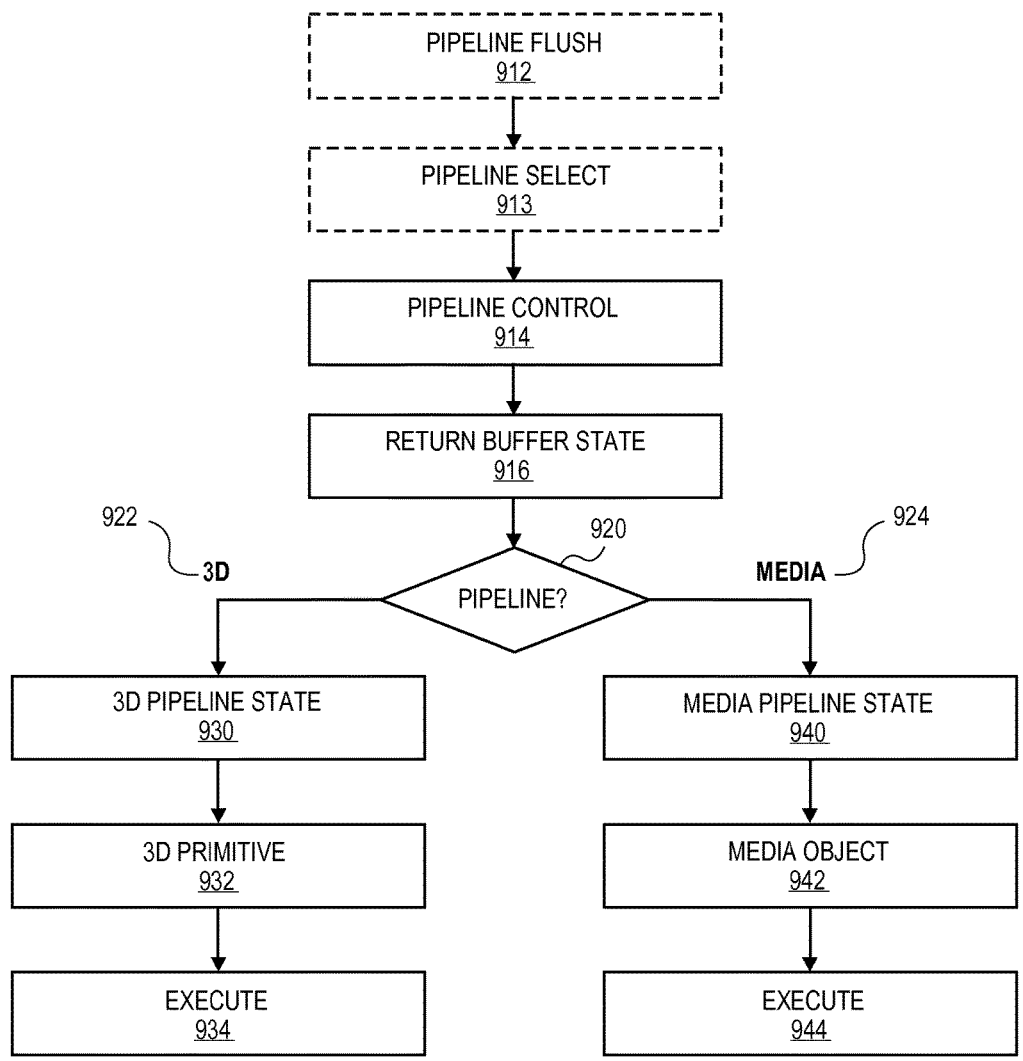

Graphics Pipeline Programming—FIG. 9A-B

FIG. 9A is a block diagram illustrating a graphics processor command format according to an embodiment and FIG. 9B is a block diagram illustrating a graphics processor command sequence according to an embodiment. The solid lined boxes in FIG. 9A illustrate the components that are generally included in a graphics command while the dashed lines include components that are optional or that are only included in a sub-set of the graphics commands. The exemplary graphics processor command format 900 of FIG. 9A includes data fields to identify a target client 902 of the command, a command operation code (opcode) 904, and the relevant data 906 for the command. A sub-opcode 905 and a command size 908 are also included in some commands.

The client 902 specifies the client unit of the graphics device that processes the command data. In one embodiment, a graphics processor command parser examines the client field of each command to condition the further processing of the command and route the command data to the appropriate client unit. In one embodiment, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 904 and, if present, sub-opcode 905 to determine the operation to perform. The client unit performs the command using information in the data 906 field of the command. For some commands an explicit command size 908 is expected to specify the size of the command. In one embodiment, the command parser automatically determines the size of at least some of the commands based on the command opcode. In one embodiment commands are aligned via multiples of a double word.

The flow chart in FIG. 9B shows a sample command sequence 910. In one embodiment, software or firmware of a data processing system that features an embodiment of the graphics processor uses a version of the command sequence shown to set up, execute, and terminate a set of graphics operations. A sample command sequence is shown and described for exemplary purposes, however embodiments are not limited to these commands or to this command sequence. Moreover, the commands may be issued as batch of commands in a command sequence, such that the graphics processor will process the sequence of commands in an at least partially concurrent manner.

The sample command sequence 910 may begin with a pipeline flush command 912 to cause any active graphics pipeline to complete the currently pending commands for the pipeline. In one embodiment, the 3D pipeline 922 and the media pipeline 924 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. A pipeline flush command 912 can be used for pipeline synchronization or before placing the graphics processor into a low power state.

A pipeline select command 913 is used when a command sequence requires the graphics processor to explicitly switch between pipelines. A pipeline select command 913 is required only once within an execution context before issuing pipeline commands unless the context is to issue commands for both pipelines. In one embodiment, a pipeline flush command is 912 is required immediately before a pipeline switch via the pipeline select command 913.

A pipeline control command 914 configures a graphics pipeline for operation and is used to program the 3D pipeline 922 and the media pipeline 924. The pipeline control command 914 configures the pipeline state for the active pipeline. In one embodiment, the pipeline control command 914 is used for pipeline synchronization and to clear data from one or more cache memories within the active pipeline before processing a batch of commands.

Return buffer state commands 916 are used to configure a set of return buffers for the respective pipelines to write data. Some pipeline operations require the allocation, selection, or configuration of one or more return buffers into which the operations write intermediate data during processing. The graphics processor also uses one or more return buffers to store output data and to perform cross thread communication. The return buffer state 916 includes selecting the size and number of return buffers to use for a set of pipeline operations.

The remaining commands in the command sequence differ based on the active pipeline for operations. Based on a pipeline determination 920, the command sequence is tailored to the 3D pipeline 922 beginning with the 3D pipeline state 930, or the media pipeline 924 beginning at the media pipeline state 940.

The commands for the 3D pipeline state 930 include 3D state setting commands for vertex buffer state, vertex element state, constant color state, depth buffer state, and other state variables that are to be configured before 3D primitive commands are processed. The values of these commands are determined at least in part based the particular 3D API in use. 3D pipeline state 930 commands are also able to selectively disable or bypass certain pipeline elements if those elements will not be used.

The 3D primitive 932 command is used to submit 3D primitives to be processed by the 3D pipeline. Commands and associated parameters that are passed to the graphics processor via the 3D primitive 932 command are forwarded to the vertex fetch function in the graphics pipeline. The vertex fetch function uses the 3D primitive 932 command data to generate vertex data structures. The vertex data structures are stored in one or more return buffers. The 3D primitive 932 command is used to perform vertex operations on 3D primitives via vertex shaders. To process vertex shaders, the 3D pipeline 922 dispatches shader execution threads to graphics processor execution units.

The 3D pipeline 922 is triggered via an execute 934 command or event. In one embodiment a register write triggers command execution. In one embodiment execution is triggered via a 'go' or 'kick' command in the command sequence. In one embodiment command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

The sample command sequence 910 follows the media pipeline 924 path when performing media operations. In general, the specific use and manner of programming for the media pipeline 924 depends on the media or compute operations to be performed. Specific media decode operations may be offloaded to the media pipeline during media decode. The media pipeline can also be bypassed and media decode can be performed in whole or in part using resources provided by one or more general purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

The media pipeline 924 is configured in a similar manner as the 3D pipeline 922. A set of media pipeline state commands 940 are dispatched or placed into in a command queue before the media object commands 942. The media pipeline state commands 940 include data to configure the media pipeline elements that will be used to process the media objects. This includes data to configure the video decode and video encode logic within the media pipeline, such as encode or decode format. The media pipeline state commands 940 also support the use one or more pointers to "indirect" state elements that contain a batch of state settings.

Media object commands 942 supply pointers to media objects for processing by the media pipeline. The media objects include memory buffers containing video data to be processed. In one embodiment, all media pipeline state must be valid before issuing a media object command 942. Once the pipeline state is configured and media object commands 942 are queued, the media pipeline 924 is triggered via an execute 934 command or an equivalent execute event (e.g., register write). Output from the media pipeline 924 may then be post processed by operations provided by the 3D pipeline 922 or the media pipeline 924. In one embodiment, GPGPU operations are configured and executed in a similar manner as media operations.

Figure 10:
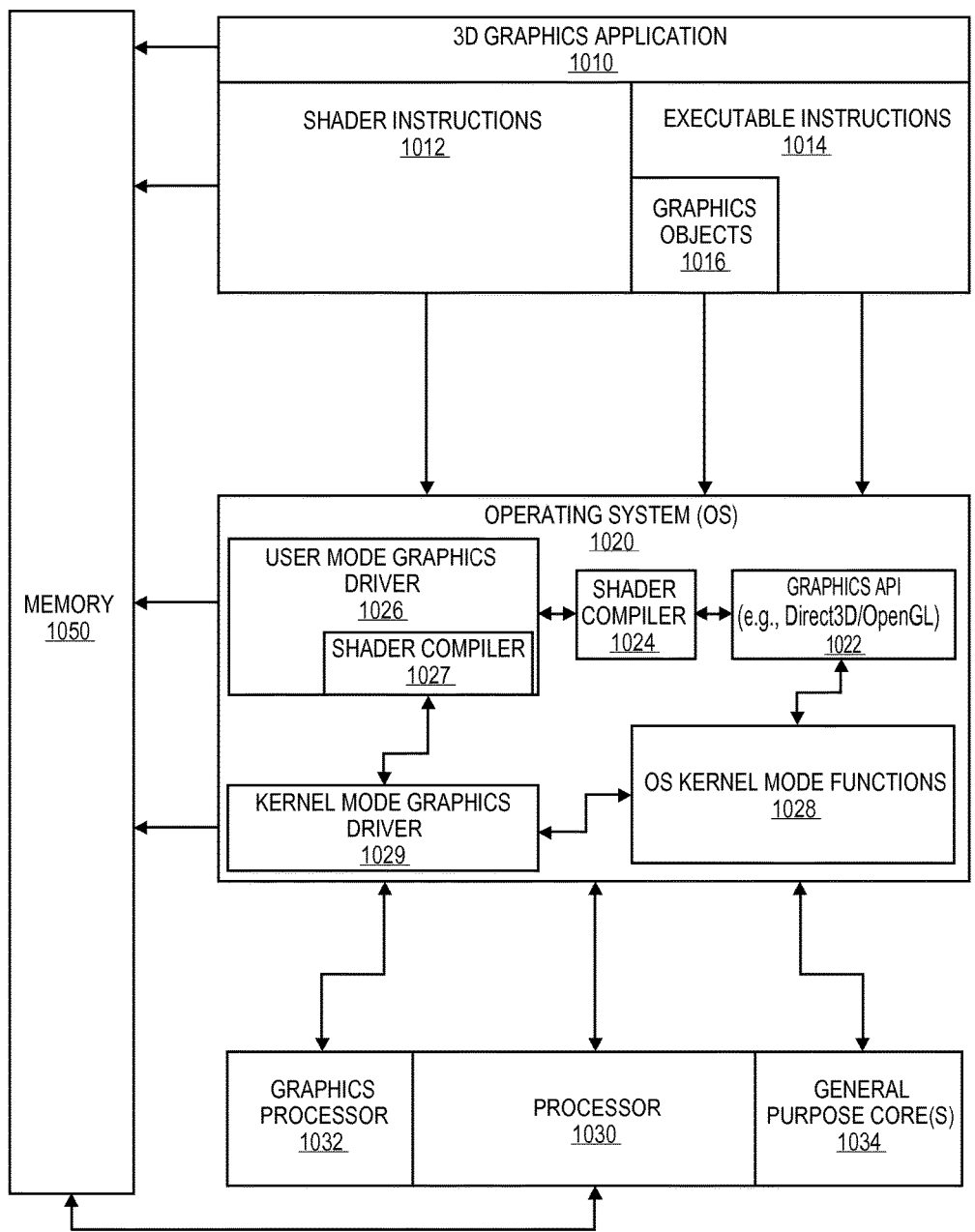
FIG. 10 illustrates exemplary graphics software architecture for a data processing system according to an embodiment.

Graphics Software Architecture—FIG. 10

FIG. 10 illustrates exemplary graphics software architecture for a data processing system according to an embodiment. The software architecture includes a 3D graphics application 1010, an operating system 1020, and at least one processor 1030. The processor 1030 includes a graphics processor 1032 and one or more general-purpose processor core(s) 1034. The graphics application 1010 and operating system 1020 each execute in the system memory 1050 of the data processing system.

In one embodiment, the 3D graphics application 1010 contains one or more shader programs including shader instructions 1012. The shader language instructions may be in a high-level shader language, such as the High Level Shader Language (HLSL) or the OpenGL Shader Language (GLSL). The application also includes executable instructions 1014 in a machine language suitable for execution by the general-purpose processor core 1034. The application also includes graphics objects 1016 defined by vertex data.

The operating system 1020 may be a Microsoft® Windows® operating system from the Microsoft Corporation, a proprietary UNIX-like operating system, or an open source UNIX-like operating system using a variant of the Linux kernel. When the Direct3D API is in use, the operating system 1020 uses a front-end shader compiler 1024 to compile any shader instructions 1012 in HLSL into a lower-level shader language. The compilation may be a just-in-time compilation or the application can perform share pre-compilation. In one embodiment, high-level shaders are compiled into low-level shaders during the compilation of the 3D graphics application 1010.

The user mode graphics driver 1026 may contain a back-end shader compiler 1027 to convert the shader instructions 1012 into a hardware specific representation. When the OpenGL API is in use, shader instructions 1012 in the GLSL high-level language are passed to a user mode graphics driver 1026 for compilation. The user mode graphics driver uses operating system kernel mode functions 1028 to communicate with a kernel mode graphics driver 1029. The kernel mode graphics driver 1029 communicates with the graphics processor 1032 to dispatch commands and instructions.

To the extent various operations or functions are described herein, they can be described or defined as hardware circuitry, software code, instructions, configuration, and/or data. The content can be embodied in hardware logic, or as directly executable software ("object" or "executable" form), source code, high level shader code designed for execution on a graphics engine, or low level assembly language code in an instruction set for a specific processor or graphics core. The software content of the embodiments described herein can be provided via an article of manufacture with the content stored thereon, or via a method of operating a communication interface to send data via the communication interface.

A non-transitory machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface is configured by providing configuration parameters or sending signals to prepare the communication interface to provide a data signal describing the software content. The communication interface can be accessed via one or more commands or signals sent to the communication interface.

Various components described can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc. Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

Figure 11:
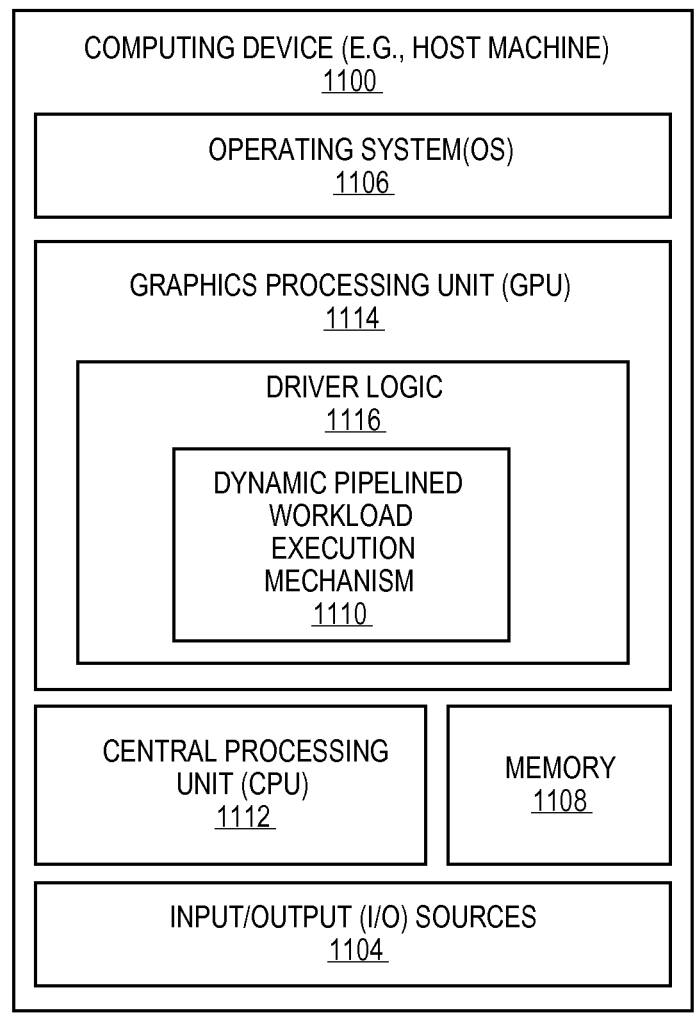
FIG. 11 illustrates a computing device employing a dynamic pipelined workload execution mechanism according to one embodiment.

FIG. 11 illustrates a computing device 1100 employing a dynamic pipelined workload execution mechanism 1110 according to one embodiment. Computing device 1100 (e.g., mobile computing device) may be the same as data processing system 100 of FIG. 1 and accordingly, for brevity and ease of understanding, many of the details stated above with reference to FIGS. 1-10 are not further discussed or repeated hereafter. Computing device 1100 may include a mobile computing device (e.g., smartphone, tablet computer, laptops, game consoles, portable workstations, etc.) serving as a host machine for hosting a dynamic pipelined workload execution mechanism ("workload mechanism") 1110 for facilitating dynamic graphics domain-based pipeline scheduling and execution of multiple workloads (also referred to as "command packages", "command packets", "packets", "packages", or simply "commands"). Workload mechanism 1110 may include any number and type of components to perform various tasks to facilitate efficient GPU-based workload scheduling and execution, such as at GPU 1114 of computing device 1100, as will be further described throughout this document. It is to be noted that throughout this document, terms like "graphics domain" may be referenced interchangeably with "graphics processing unit" or simply "GPU" and similarly, "CPU domain" or "host domain" may be referenced interchangeably with "computer processing unit" or simply "CPU".

Computing device 1100 may include any number and type of communication devices, such as large computing systems, such as server computers, desktop computers, etc., and may further include set-top boxes (e.g., Internet-based cable television set-top boxes, etc.), global positioning system (GPS)-based devices, etc. Computing device 1100 may include mobile computing devices serving as communication devices, such as cellular phones including smartphones, personal digital assistants (PDAs), tablet computers, laptop computers, e-readers, smart televisions, television platforms, wearable devices (e.g., glasses, watches, bracelets, smartcards, jewelry, clothing items, etc.), media players, etc. For example, in one embodiment, computing device 1100 may include a mobile computing device employing an integrated circuit ("IC"), such as system on a chip ("SoC" or "SOC"), integrating various hardware and/or software components of computing device 1100 on a single chip.

As illustrated, in one embodiment, in addition to employing workload mechanism 1110, computing device 1100 may further include any number and type of hardware components and/or software components, such as (but not limited to) CPU 1112, GPU 1114 having graphics driver logic 1116 hosting workload mechanism 1110, memory 1108, network devices, drivers, or the like, as well as input/output (I/O) sources 1104, such as touchscreens, touch panels, touch pads, virtual or regular keyboards, virtual or regular mice, ports, connectors, etc. Computing device 1100 may include operating system (OS) 1106 serving as an interface between hardware and/or physical resources of the computer device 1100 and a user. It is contemplated that CPU 1112 may include one or processors, such as processor(s) 102 of FIG. 1, while GPU 1114 may include one or more graphics processors, such as graphics processor(s) 108 of FIG. 1. In one embodiment and as will be further descried with reference to the subsequent figures, workload mechanism 1110 may be in communication with its host driver logic 1116 which cooperates with GPU 1114 to facilitate any number and type of tasks facilitating GPU-based parallel scheduling of commands as is described through this document.

It is to be noted that terms like "node", "computing node", "server", "server device", "cloud computer", "cloud server", "cloud server computer", "machine", "host machine", "device", "computing device", "computer", "computing system", and the like, may be used interchangeably throughout this document. It is to be further noted that terms like "application", "software application", "program", "software program", "package", "software package", and the like, may be used interchangeably throughout this document. Also, terms like "job", "input", "request", "message", and the like, may be used interchangeably throughout this document.

It is contemplated and as further described with reference to FIGS. 1-10, some processes of the graphics pipeline as described above are implemented in software, while the rest are implemented in hardware. A graphics pipeline may be implemented in a graphics coprocessor design, where CPU 1112 is designed to work with GPU 1114 which may be included in or co-located with CPU 1112. In one embodiment, GPU 1114 may employ any number and type of conventional software and hardware logic to perform the conventional functions relating to graphics rendering as well as novel software and hardware logic to execute any number and type of instructions, such as instructions 121 of FIG. 1, to perform the various novel functions of workload mechanism 1110 as disclosed throughout this document.

As aforementioned, memory 1108 may include a random access memory (RAM) comprising application database having object information. A memory controller hub, such as memory controller hub 116 of FIG. 1, may access data in the RAM and forward it to GPU 1114 for graphics pipeline processing. RAM may include double data rate RAM (DDR RAM), extended data output RAM (EDO RAM), etc. CPU 1112 interacts with a hardware graphics pipeline, as illustrated with reference to FIG. 3, to share graphics pipelining functionality. Processed data is stored in a buffer in the hardware graphics pipeline, and state information is stored in memory 1108. The resulting image is then transferred to a display component or device, such as display device 320 of FIG. 3, for displaying. It is contemplated that the display device may be of various types, such as Cathode Ray Tube (CRT), Thin Film Transistor (TFT), Liquid Crystal Display (LCD), Organic Light Emitting Diode (OLED) array, etc., to display information to a user.

Memory 1108 may comprise a pre-allocated region of a buffer (e.g., frame buffer); however, it should be understood by one of ordinary skill in the art that the embodiments are not so limited, and that any memory accessible to the lower graphics pipeline may be used. Computing device 1100 may further include input/output (I/O) control hub (ICH) 130 as referenced in FIG. 1, one or more I/O devices, etc.

CPU 1112 may include one or more processors to execute instructions in order to perform whatever software routines the computing system implements. The instructions frequently involve some sort of operation performed upon data. Both data and instructions may be stored in system memory 1108 and any associated cache. Cache is typically designed to have shorter latency times than system memory 1108; for example, cache might be integrated onto the same silicon chip(s) as the processor(s) and/or constructed with faster static RAM (SRAM) cells whilst the system memory 1108 might be constructed with slower dynamic RAM (DRAM) cells. By tending to store more frequently used instructions and data in the cache as opposed to the system memory 1108, the overall performance efficiency of computing device 1100 improves. It is contemplated that in some embodiments, GPU 1114 may exist as part of CPU 1112 (such as part of a physical CPU package) in which case, memory 1108 may be shared by CPU 1112 and GPU 1114 or kept separated.

System memory 1108 may be made available to other components within the computing device 1100. For example, any data (e.g., input graphics data) received from various interfaces to the computing device 1100 (e.g., keyboard and mouse, printer port, Local Area Network (LAN) port, modem port, etc.) or retrieved from an internal storage element of the computer device 1100 (e.g., hard disk drive) are often temporarily queued into system memory 1108 prior to their being operated upon by the one or more processor(s) in the implementation of a software program. Similarly, data that a software program determines should be sent from the computing device 1100 to an outside entity through one of the computing system interfaces, or stored into an internal storage element, is often temporarily queued in system memory 1108 prior to its being transmitted or stored.

Further, for example, an ICH, such as ICH 130 of FIG. 1, may be used for ensuring that such data is properly passed between the system memory 1108 and its appropriate corresponding computing system interface (and internal storage device if the computing system is so designed) and may have bi-directional point-to-point links between itself and the observed I/O devices. Similarly, an MCH, such as MCH 116 of FIG. 1, may be used for managing the various contending requests for system memory 1108 accesses amongst CPU 1112 and GPU 1114, interfaces and internal storage elements that may proximately arise in time with respect to one another.

I/O sources 1104 may include one or more I/O devices that are implemented for transferring data to and/or from computing device 1100 (e.g., a networking adapter); or, for a large scale non-volatile storage within computing device 1100 (e.g., hard disk drive). User input device, including alphanumeric and other keys, may be used to communicate information and command selections to GPU 1114. Another type of user input device is cursor control, such as a mouse, a trackball, a touchscreen, a touchpad, or cursor direction keys to communicate direction information and command selections to GPU 1114 and to control cursor movement on the display device. Camera and microphone arrays of computer device 1100 may be employed to observe gestures, record audio and video and to receive and transmit visual and audio commands.

Computing device 1100 may further include network interface(s) to provide access to a network, such as a LAN, a wide area network (WAN), a metropolitan area network (MAN), a personal area network (PAN), Bluetooth, a cloud network, a mobile network (e.g., $3^{rd}$ Generation (3G), etc.), an intranet, the Internet, etc. Network interface(s) may include, for example, a wireless network interface having antenna, which may represent one or more antenna(e). Network interface(s) may also include, for example, a wired network interface to communicate with remote devices via network cable, which may be, for example, an Ethernet cable, a coaxial cable, a fiber optic cable, a serial cable, or a parallel cable.

Network interface(s) may provide access to a LAN, for example, by conforming to IEEE 802.11b and/or IEEE 802.11g standards, and/or the wireless network interface may provide access to a personal area network, for example, by conforming to Bluetooth standards. Other wireless network interfaces and/or protocols, including previous and subsequent versions of the standards, may also be supported. In addition to, or instead of, communication via the wireless LAN standards, network interface(s) may provide wireless communication using, for example, Time Division, Multiple Access (TDMA) protocols, Global Systems for Mobile Communications (GSM) protocols, Code Division, Multiple Access (CDMA) protocols, and/or any other type of wireless communications protocols.

Network interface(s) may include one or more communication interfaces, such as a modem, a network interface card, or other well-known interface devices, such as those used for coupling to the Ethernet, token ring, or other types of physical wired or wireless attachments for purposes of providing a communication link to support a LAN or a WAN, for example. In this manner, the computer system may also be coupled to a number of peripheral devices, clients, control surfaces, consoles, or servers via a conventional network infrastructure, including an Intranet or the Internet, for example.

It is to be appreciated that a lesser or more equipped system than the example described above may be preferred for certain implementations. Therefore, the configuration of computing device 1100 may vary from implementation to implementation depending upon numerous factors, such as price constraints, performance requirements, technological improvements, or other circumstances. Examples of the electronic device or computer system 1100 may include (without limitation) a mobile device, a personal digital assistant, a mobile computing device, a smartphone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combinations thereof.

Embodiments may be implemented as any or a combination of: one or more microchips or integrated circuits interconnected using a parentboard, hardwired logic, software stored by a memory device and executed by a microprocessor, firmware, an application specific integrated circuit (ASIC), and/or a field programmable gate array (FPGA). The term "logic" may include, by way of example, software or hardware and/or combinations of software and hardware.

Embodiments may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments described herein. A machine-readable medium may include, but is not limited to, floppy diskettes, optical disks, CD-ROMs (Compact Disc-Read Only Memories), and magneto-optical disks, ROMs, RAMs, EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

Moreover, embodiments may be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection).

Figure 12:
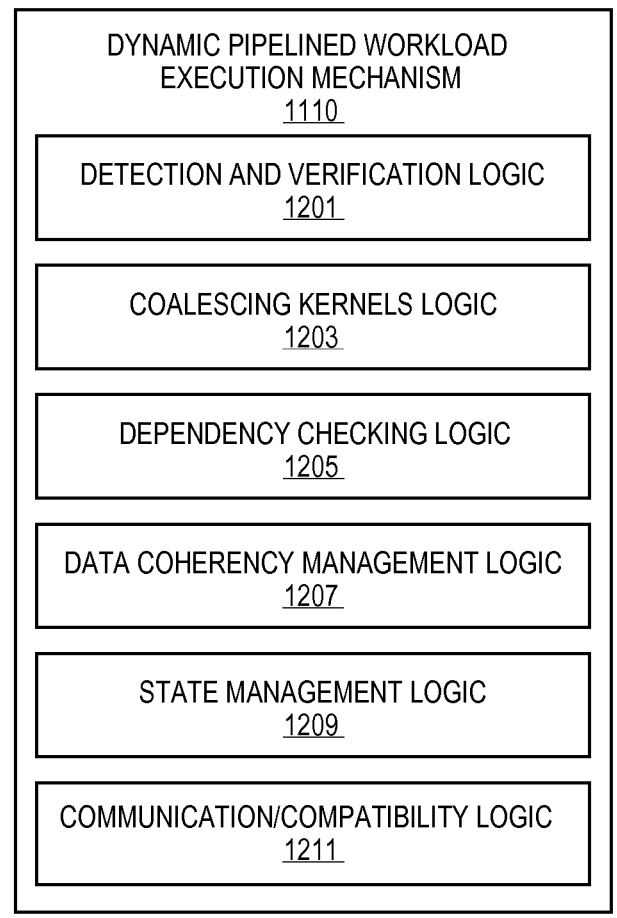
FIG. 12 illustrates a dynamic pipelined workload execution mechanism according to one embodiment.

FIG. 12 illustrates a dynamic pipelined workload execution mechanism 1110 according to one embodiment. In one embodiment, workload mechanism 1110 may include any number and type of components to perform various tasks relating to facilitating dynamic and efficient pipeline scheduling and executing of multiple workloads at computing devices, such as computing device 1100 of FIG. 11. For example and in one embodiment, workload mechanism 1110 may include (but not limited to): detection and verification logic 1201; coalescing kernels logic ("coalescing logic") 1203; dependency checking logic ("dependency logic") 1205; data coherency management logic ("data logic") 1207; state management logic ("state logic") 1209; and communication/compatibility logic 1211. It is further illustrated and as aforementioned with reference to FIG. 11, workload mechanism 1110 may be part of driver logic 1116 which cooperates with GPU 1114 which in turn facilitates performance of one or more tasks relating to GPU-based parallel execution of multiple workloads in pipelines on GPU 1114.

In one embodiment, detection and verification logic 1201 may be used to receive/detect command buffers (also referred to as "batch buffers" or simply "commands") which may then be authenticated/verified by detection and verification logic 1201 prior to being processed at the GPU. For example, it is contemplated that just as instructions are processed at CPUs, kernels are processed at GPUs and thus, each command in a command buffer (which may include any number and type of commands) may be associated with or added by a kernel as directed, for example, by a software application. It is further contemplated that a new command may be a command that is newly issued by the software application or a previously stored command that was deferred for a while and is now ready for processing and so it may be timely received and/or detected by detection and verification logic 1201.

As will be further described with respect to other components of workload mechanism 1110, such as dependency checking logic 1207, any number and type of events (also referred to as "contingency events", "dependency events", or simply "contingencies" or "dependencies", etc.), such as dependency events, etc., and/or their status may be detected and verified by detection and verification logic 1201 such that these events may be handled appropriately prior to processing the corresponding commands.

Upon detection and verification of command buffers, events, etc., in one embodiment, coalescing logic 1203 may be triggered to perform operations of submitting workloads to the GPU, such as GPU 1114, while interacting with the operating system, such as operating system 1106 of FIG. 11. For example, any GPU workload may be sent to the operating system in a command buffer that may also contain any associated state information that the operating system and the relevant hardware may need; however, this may result in a significant amount of bookkeeping (also referred to as "flush overhead"). To reduce this flush overhead, in one embodiment, multiple kernels may be merged together into a single command buffer as facilitated by coalescing logic 1203. This command buffer may then be communicated to the operating system and any relevant hardware for further processing, such as when system resources are deemed insufficient to resolve application requests or instructions.

In one embodiment, dependency logic 1205 may be then be used to determine whether there are any events relating to the kernels in the command buffer that need to be satisfied for the command buffer and its corresponding tasks to be processed and completed. For example and in one embodiment, upon having detection and verification logic 1201 detect and verify a workload that is pipelined using a command buffer as facilitated by coalescing logic 1203, any resources being used by the kernels associated with the command buffer may be maintained by the driver or driver logic of the GPU, such as via driver logic 1116 of GPU 1114 of FIG. 11. Along with maintaining the resources, the driver logic may further maintain any information relating to the state of the resources as well as the access qualifiers.

If one or more events are detected or checked by dependency logic 1205, then one or more serialization events may be inserted; otherwise, the kernels of the command buffer are pipelined to be processed without having the need for inserting any serialization events. It is contemplated that while such dependency or contingency events are handled or waited upon being resolved, a number of resource threads may stay idle, leading to a waste. For example, if a command buffer includes 5 kernels (e.g., k1, k2, k3, k4, k5) that are to be processed and dependency logic 1205 detects that the software application requires that k3 may not be processed without having processed k2, the entire command buffer might wait until k2 is processed. In some cases, the application may set a condition that k3 may not be processed until k2 is fully processed and completed and retired in memory, leading to even greater delays. It is contemplated that if the kernels in the queue are not to be processed in a particular order or sequence (e.g., in case of an out-of-order queue), then, continuing with the above example, k4 and k5 may be processed while k3 waits for k2 to be processed.

Now, for example, if a GPU has 128 threads and merely 28 threads are being used by k2, then, due to k3's dependency on k2, further processing may have to wait until the k2 processing on all 28 threads is completed, before the subsequent kernel, k3, may be processed. In this particular example with this sort of dependency event, nearly 100 threads may remain idle the execution of the command buffer until the dependency event is fully satisfied. Stated differently, without this dependency event to be satisfied, these 100 threads may be used for processing along with other 28 threads, making the system far more efficient.

In one embodiment, continuing with the above example, dependency logic 1205 may detect the dependency event that k3 may not be processed until k2 is satisfied and if the queue is in order, then k4 and k5 may also not begin to be processed until their preceding kernels are processed. Upon detecting the dependency event, dependency logic 1205 may communicate this information with coalescing logic 1203 which may then generate multiple command buffers (such as a first buffer having k1 and k3, and a second buffer having k3, k4, and k5), as opposed to generating a single command buffer having all five kernels k1-k5, and submit both command buffers to pipelines for processing while overcoming the dependency event.

In one embodiment, data logic 1207 may be used for management of cache associated with GPUs, such as GPU 1114 of FIG. 11, so that each cache is used to its maximum capacity for processing of workloads. This cache management as facilitated by data logic 1207 avoids or overcomes forced flushing of GPUs or forcing coherent "snoop" cycles so that any loss of resources may be minimized and a highest level of performance may be achieved. For example, it is contemplated that GPUs may have a hierarchy of cache and that some cache in the hierarchy may be coherent with the host operating system while the may not be as such. Therefore, flushing a GPU cache or forcing coherent "snoop" cycles on the host may impact performance as well. For example, driver logic, such as driver logic 1114 of FIG. 11, of a driver at a GPU may judiciously manage the cache by flushing them only when necessary and marking certain surfaces as "not coherent" in order to avoid snoop penalty. Further, the surface type may play a role in decision making, such as the texture data path in GPUs may be different from data port or buffer data path. Texture may not be coherent with the host and thus, workloads that write to textures may flush the appropriate cache for correctness. Accordingly, in one embodiment and as aforementioned, cache and data coherency management may be achieved through data logic 1207.

In one embodiment, state logic 1209 may be used to schedule work on a GPU, where state logic 1209 cooperates with the driver logic of the GPU, such as driver logic 1114 of GPU 1114 of FIG. 11, to program command buffers and setup descriptors that, in some embodiments, may be hardware-specific or software-specific. For example and in one embodiment, kernel threads may be scheduled by executing one or more execution commands, such as GPGPU-WALKER, as facilitated by state logic 1209. These commands may be executed within the GPU and it may then be the driver logic's responsibility to ensure that the GPU hardware pipeline is not stalled as well as the latency is reduced or eliminated.

In one embodiment, state logic 1209 may be used to dynamically setup any descriptors prior to initiation of an execution command, such as GPGPU-WALKER command. For example, GPGPU-WALKER may be used as a GPU command to execute a kernel (e.g., workload), where the command spawns over multiple GPU threads. This dynamic setup facilitates the GPU to program the state prior to executing the work, while the descriptor writes are globally visible before the GPGPU-WALKER can load the descriptor, such as returning the last written data. Therefore, in one embodiment, instead of using a write-stall-until-complete, a new scheme may be provided by state logic 1209 such that a subsequent read pushes the write cycle in the pipeline. This novel and innovative technique, in one embodiment, eliminates stalls in the pipeline (e.g., hardware pipeline) caused by any posted writes.

In another embodiment, a data structure (e.g., hardware data structure, such as interface descriptor) may be 32 bytes (e.g., half a cache line in GPU), where the hardware may cache the descriptor when executed a kernel. If, for example, the subsequent kernel scheduled uses the next descriptor that maps to the other half of the cache line, then the subsequent GPGPU-WALKER may fetch stale descriptor data (e.g., descriptor) cache that is not snooped. Therefore, the driver logic, such as driver logic 1116 of FIG. 11, may be smart about descriptor management to avoid such types of pitfalls.

Communication/compatibility logic 1211 may be used to facilitate dynamic communication and compatibility between one or more computing devices, such as computing device 1100 of FIG. 11, and any number and type of other computing devices (such as mobile computing device, desktop computer, server computing device, etc.), processing devices (such as central processing unit (CPU), graphics processing unit (GPU), etc.), image capturing devices (such as camera), display elements (such as display component, display device, display screen, etc.), user/context-awareness components and/or identification/verification sensors/devices (such as biometric sensor/detector, scanner, etc.), memory or storage devices, databases and/or data sources (such as data storage device, hard drive, solid-state drive, hard disk, memory card or device, memory circuit, etc.), networks (e.g., cloud network, the Internet, intranet, cellular network, proximity networks, such as Bluetooth, Bluetooth low energy (BLE), Bluetooth Smart, Wi-Fi proximity, Radio Frequency Identification (RFID), Near Field Communication (NFC), Body Area Network (BAN), etc.), wireless or wired communications and relevant protocols (e.g., Wi-Fi®, WiMAX, Ethernet, etc.), connectivity and location management techniques, software applications/websites, (e.g., social and/or business networking websites, such as Facebook®, LinkedIn®, Google+®, Twitter®, etc., business applications, games and other entertainment applications, etc.), programming languages, etc., while ensuring compatibility with changing technologies, parameters, protocols, standards, etc.

Throughout this document, terms like "logic", "component", "module", "framework", "engine", and the like, may be referenced interchangeably and include, by way of example, software, hardware, and/or any combination of software and hardware, such as firmware. Further, any use of a particular brand, word, term, phrase, name, and/or acronym, such as "GPU", "GPU domain", "CPU", "CPU domain", "thread", "buffer", "command", "command buffer", "batch buffer", "parallel", "scheduling", "pipelining", "driver", "driver logic", "OpenCL™", "kernel", "barrier", etc., should not be read to limit embodiments to software or devices that carry that label in products or in literature external to this document.

It is contemplated that any number and type of components may be added to and/or removed from workload mechanism 1110 to facilitate various embodiments including adding, removing, and/or enhancing certain features. For brevity, clarity, and ease of understanding of workload mechanism 1110, many of the standard and/or known components, such as those of a computing device, are not shown or discussed here. It is contemplated that embodiments, as described herein, are not limited to any particular technology, topology, system, architecture, and/or standard and are dynamic enough to adopt and adapt to any future changes.

Figure 13:
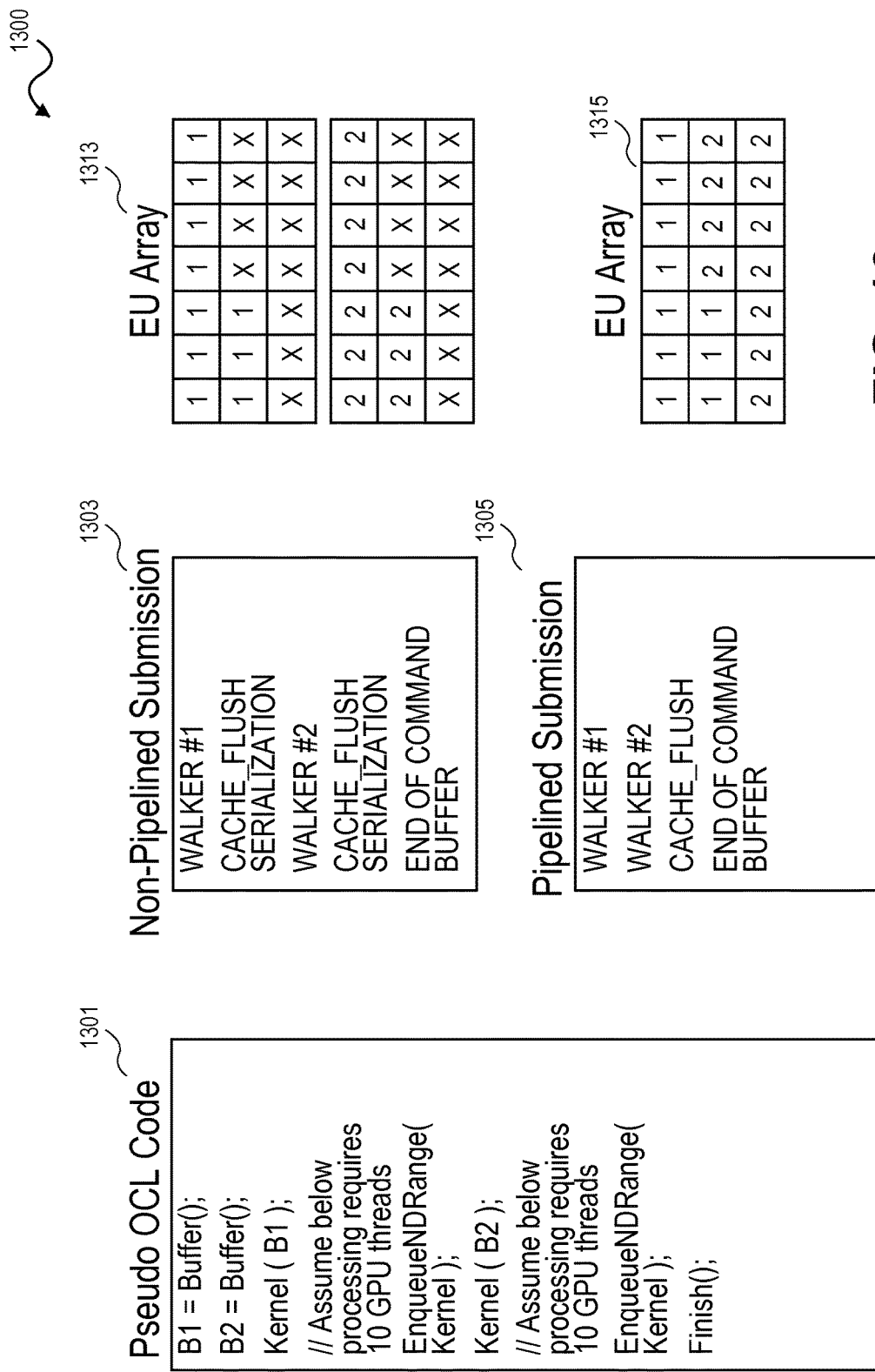
FIG. 13 illustrates a transaction sequence for pipelining and executing of workloads at according to one embodiment.

FIG. 13 illustrates a transaction sequence 1300 for pipelining and executing of workloads at GPUs according to one embodiment. Transaction sequence 1300 may be performed by processing logic that may comprise hardware (e.g., circuitry, dedicated logic, programmable logic, etc.), software (such as instructions run on a processing device), or a combination thereof. In one embodiment, transaction sequence 1300 may be performed by workload mechanism 1110 of FIGS. 11-12. The processes of transaction sequence 1300 are illustrated in linear sequences for brevity and clarity in presentation; however, it is contemplated that any number of them can be performed in parallel, asynchronously, or in different orders. For brevity, many of the details discussed with reference to the preceding FIGS. 1-12 may not be discussed or repeated hereafter.

As illustrated, in one embodiment, a sample code 1301 (e.g., pseudo Object Constraint Language (OCL) code) is provided to be executed to be processed. Further, two processing options 1303, 1305 are illustrated, where the first processing option does not use pipelines or pipelining of commands, such as non-pipelined submission 1303, while the second processing option, in one embodiment, uses pipelines or pipelining of commands, such as pipelined submission 1305.

As illustrated, non-pipelined submission 1303 is shown to be much longer and having a bigger number of commands, where non-pipelined submission 1303 includes multiple cache flush serializations and then on to the end of command buffer. In one embodiment, pipelined submission 1305, on the other hand, goes straight from a couple of WALKER commands to a cache flush and on to the end of command buffer. Correspondingly, in the illustrated embodiment, non-pipelined submission 1303 results in execution unit (EU) array 1313 which is far larger than EU array 1315 produced as a result of pipelined submission 1305 as facilitated by workload mechanism 1110 of FIG. 11. As illustrated, in using these execution commands, such as pipeline walkers (e.g., WALKERS), a significant performance improvement may be achieved along with a reduction in power consumption.

Figure 14:
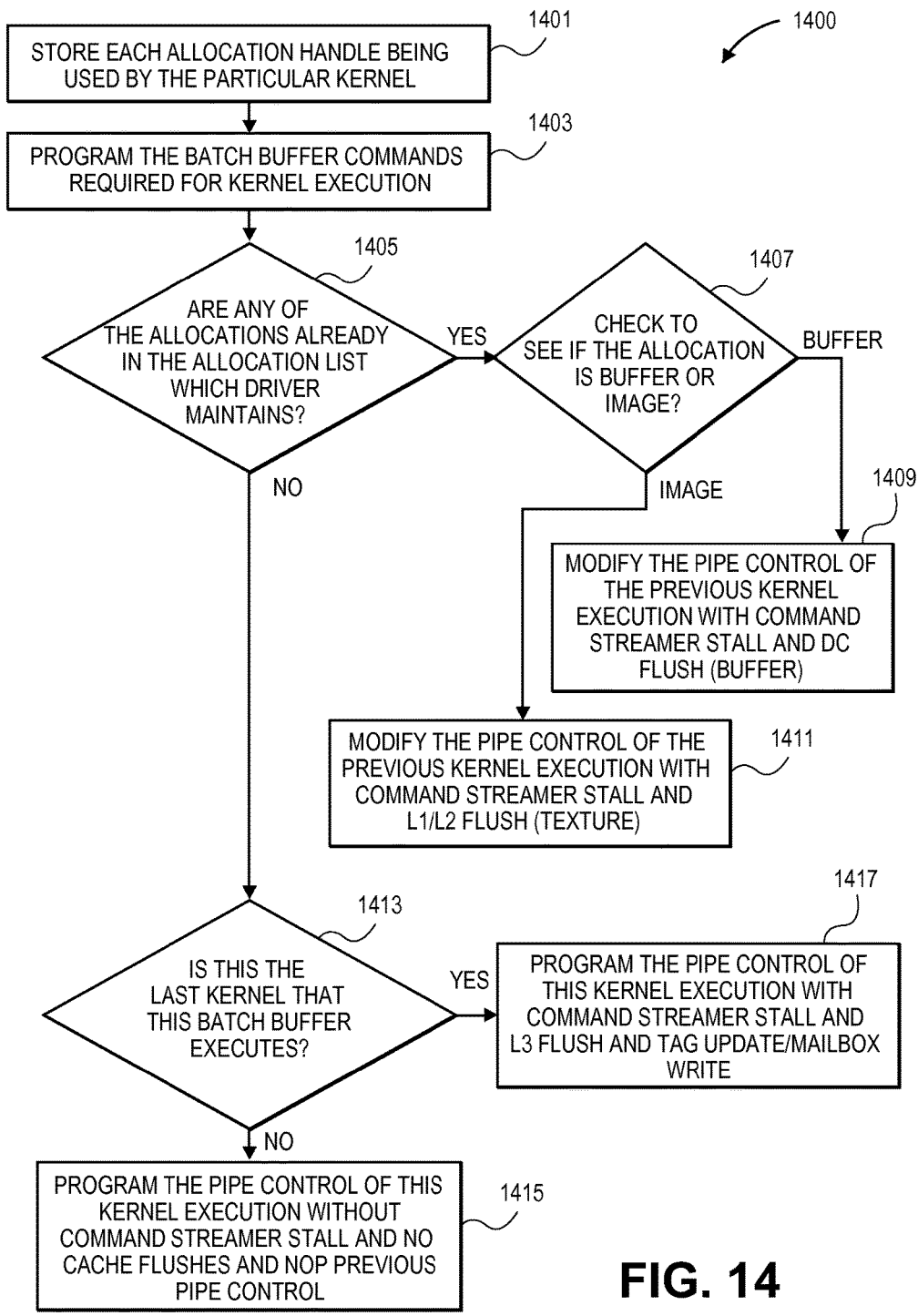
FIG. 14 illustrates a method for pipelining and executing of workloads according to one embodiment.

FIG. 14 illustrates a method 1400 for pipelining and executing of workloads at GPUs according to one embodiment. Method 1400 may be performed by processing logic that may comprise hardware (e.g., circuitry, dedicated logic, programmable logic, etc.), software (such as instructions run on a processing device), or a combination thereof. In one embodiment, method 1400 may be performed by workload mechanism 1110 of FIGS. 11-12. The processes of method 1400 are illustrated in linear sequences for brevity and clarity in presentation; however, it is contemplated that any number of them can be performed in parallel, asynchronously, or in different orders. For brevity, many of the details discussed with reference to the preceding FIGS. 1-13 may not be discussed or repeated hereafter.

Method 1400 beings at block 1401 with storing of an allocation handle being used by a particular kernel of a command buffer. An allocation handle includes a handle to the memory surface that a user mode driver (UMD) gets from the operating system. At block 1403, any commands in the command buffer relating to this kernel are then programmed for kernel execution as facilitated by coalescing logic 1203 and state logic 1209 of FIG. 12. At block 1405, a determination is made as to whether there are any allocations already in an allocation list which the driver logic, such as driver logic 1116 of FIG. 12, maintains. In one embodiment, the decision process of block 1405 is based on dependency check to determine any contingencies of dependencies between kernels of the command buffer as determined and facilitated by dependency logic 1205 of FIG. 12. If there is such a list, another determination is made as to whether the allocations are buffer or image at block 1407 as facilitated by data logic 1207 of FIG. 12. If the allocations are buffers, at block 1409, the pipe control of the previous kernel execution may be modified with a command processor (e.g., command streamer (CS) stall or STALL) and a cache flush (e.g., DC flush) is performed for the buffer. If, however, the allocations are images, at block 1411, the previous pipe control of the previous kernel execution is modified with a command processor (e.g., command steamer STALL) and a cache flush (e.g., levels L1, L2 flush) is performed for texture.

In computing systems, a central processing unit (CPU) cache of a computing device refers to a cache to reduce the average time to access data from the main memory of the computing device. A cache is generally smaller and faster memory which stores copies of data from frequently used locations of the main memory. It is contemplated that most CPUs may have different caches, such as data caches, instruction caches, etc., organized in a hierarchy of cache levels. For example, a data cache may be organized as having cache levels, such as L1, L2, L3, etc., as referenced in this document. Further, it is contemplated that cache lines are fetched and the time it takes to fetch a single cache line from memory (e.g., read latency) may be of importance as, at this state, the CPU may run out of things to perform while waiting for the cache line, where this state of the CPU may be referenced as CPU stall or STALL as referenced in this document.

Referring back to block 1405, in one embodiment, if there are no allocations in the list, the process continue at block 1413 with another determination as to whether this kernel is the last kernel that the command buffer executes as facilitated by data logic 1207 of FIG. 12. If not, at block 1415, the cache does not need to be flushed and pipe control is programmed (e.g., the pipe control of this kernel execution is programmed) without the use of a command processor (e.g., command streamer STALL and no cache flushes and no operation (NOP) previous pipe control). If yes, at block 1417, the cache is flushed, such as the pipe control of this kernel execution is programmed with a command processor (e.g., command streamer STALL and level L3 flush tag update/mailbox write).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the foregoing specification, embodiments have been described with reference to specific exemplary embodiments thereof. It will, however, be evident that various modifications and changes may be made thereto without departing from the broader spirit and scope of embodiments as set forth in the appended claims. The Specification and drawings are, accordingly, to be regarded in an illustrative rather than a restrictive sense.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system for facilitating hybrid communication according to embodiments and examples described herein.

Some embodiments pertain to Example 1 that includes an apparatus to facilitate dynamic pipelining of workload executions at graphics processing units on computing devices, comprising: coalescing kernels logic to generate a command buffer having a plurality of kernels relating to a plurality of workloads to be executed at a graphics processing unit (GPU); and state management logic to pipeline the workloads to be processed at the GPU, wherein pipelining includes scheduling each kernel to be executed on the GPU based on at least one of availability of resource threads and status of one or more dependency events relating to each kernel in relation to other kernels of the plurality of kernels.

Example 2 includes the subject matter of Example 1, further comprising dependency checking logic to determine the status of the one or more dependency events, wherein the status indicates whether the one or more dependency events remain unresolved, wherein a dependency event includes a contingency event relating to a base kernel of the plurality of kernels such that the base kernel is to be executed, at least partially, to resolve the contingency event and initiate execution of one or more subsequent kernels of the plurality of kernels.

Example 3 includes the subject matter of Example 2, further comprising data coherency management logic to determine the availability of resource threads based on the one or more dependency events, wherein determining the availabilities includes detecting one or more idle resource threads that remain unused due to the one or more dependency events remaining unresolved.

Example 4 includes the subject matter of Example 1, wherein the state management logic is further to acquire the one or more idle resource threads, and pipeline one or more non-dependency kernels of the plurality of kernels for processing on the one or more idle resource threads without having to delay the processing or stall the GPU while the one or more subsequent kernels await satisfaction of the one or more dependency events, wherein the state management logic is further to pipeline the one or more subsequent kernels for processing at the GPU upon satisfaction of the one or more dependency events without having to stall the GPU.

Example 5 includes the subject matter of Example 4, wherein the state management logic is further to pipeline the one or more subsequent kernels for processing at the GPU upon satisfaction of the one or more dependency events without having to stall the GPU.

Example 6 includes the subject matter of Example 1, wherein the resource threads comprise one or more of GPU hardware threads, command buffers, executable code, and memory heaps.

Example 7 includes the subject matter of Example 1, wherein the command buffer comprises a plurality of commands associated with the plurality of workloads, wherein the commands include one or more processing commands relating to the plurality of workloads and further include data having status data relating to the plurality of workloads, wherein the processing commands and the data are dispatched in pipeline to the GPU.

Example 8 includes the subject matter of Example 2, wherein the one or more dependency events include at least one of incompletion of processing of a base command associated with the base kernel, and unavailability of one or more of the resource threads, wherein the one or more subsequent kernels are associated with one or more subsequent commands depending from the base command.

Some embodiments pertain to Example 9 that includes a method for facilitating dynamic pipelining of workload executions at graphics processing units on computing devices, comprising: generating a command buffer having a plurality of kernels relating to a plurality of workloads to be executed at a graphics processing unit (GPU); and pipelining the workloads to be processed at the GPU, wherein pipelining includes scheduling each kernel to be executed on the GPU based on at least one of availability of resource threads and status of one or more dependency events relating to each kernel in relation to other kernels of the plurality of kernels.

Example 10 includes the subject matter of Example 9, further comprising determining the status of the one or more dependency events, wherein the status indicates whether the one or more dependency events remain unresolved, wherein a dependency event includes a contingency event relating to a base kernel of the plurality of kernels such that the base kernel is to be executed, at least partially, to resolve the contingency event and initiate execution of one or more subsequent kernels of the plurality of kernels.

Example 11 includes the subject matter of Example 10, further comprising determining the availability of resource threads based on the one or more dependency events, wherein determining the availabilities includes detecting one or more idle resource threads that remain unused due to the one or more dependency events remaining unresolved.

Example 12 includes the subject matter of Example 9, further comprising acquiring the one or more idle resource threads, and pipeline one or more non-dependency kernels of the plurality of kernels for processing on the one or more idle resource threads without having to delay the processing or stall the GPU while the one or more subsequent kernels await satisfaction of the one or more dependency events.

Example 13 includes the subject matter of Example 12, further comprising pipelining the one or more subsequent kernels for processing at the GPU upon satisfaction of the one or more dependency events without having to stall the GPU.

Example 14 includes the subject matter of Example 9, wherein the resource threads comprise one or more of GPU hardware threads, command buffers, executable code, and memory heaps.

Example 15 includes the subject matter of Example 9, wherein the command buffer comprises a plurality of commands associated with the plurality of workloads, wherein the commands include one or more processing commands relating to the plurality of workloads and further include data having status data relating to the plurality of workloads, wherein the processing commands and the data are dispatched in pipeline to the GPU.

Example 16 includes the subject matter of Example 10, wherein the one or more dependency events include at least one of incompletion of processing of a base command associated with the base kernel, and unavailability of one or more of the resource threads, wherein the one or more subsequent kernels are associated with one or more subsequent commands depending from the base command.

Example 17 includes at least one machine-readable medium comprising a plurality of instructions, when executed on a computing device, to implement or perform a method or realize an apparatus as claimed in any preceding claims.

Example 18 includes at least one non-transitory or tangible machine-readable medium comprising a plurality of instructions, when executed on a computing device, to implement or perform a method or realize an apparatus as claimed in any preceding claims.

Example 19 includes a system comprising a mechanism to implement or perform a method or realize an apparatus as claimed in any preceding claims.

Example 20 includes an apparatus comprising means to perform a method as claimed in any preceding claims.

Example 21 includes a computing device arranged to implement or perform a method or realize an apparatus as claimed in any preceding claims.

Example 22 includes a communications device arranged to implement or perform a method or realize an apparatus as claimed in any preceding claims.

Some embodiments pertain to Example 23 includes a system comprising a storage device having instructions, and a processor to execute the instructions to facilitate a mechanism to perform one or more operations comprising: generating a command buffer having a plurality of kernels relating to a plurality of workloads to be executed at a graphics processing unit (GPU); and pipelining the workloads to be processed at the GPU, wherein pipelining includes scheduling each kernel to be executed on the GPU based on at least one of availability of resource threads and status of one or more dependency events relating to each kernel in relation to other kernels of the plurality of kernels.

Example 24 includes the subject matter of Example 23, further comprising determining the status of the one or more dependency events, wherein the status indicates whether the one or more dependency events remain unresolved, wherein a dependency event includes a contingency event relating to a base kernel of the plurality of kernels such that the base kernel is to be executed, at least partially, to resolve the contingency event and initiate execution of one or more subsequent kernels of the plurality of kernels.

Example 25 includes the subject matter of Example 24, further comprising determining the availability of resource threads based on the one or more dependency events, wherein determining the availabilities includes detecting one or more idle resource threads that remain unused due to the one or more dependency events remaining unresolved.

Example 26 includes the subject matter of Example 23, further comprising acquiring the one or more idle resource threads, and pipeline one or more non-dependency kernels of the plurality of kernels for processing on the one or more idle resource threads without having to delay the processing or stall the GPU while the one or more subsequent kernels await satisfaction of the one or more dependency events.

Example 27 includes the subject matter of Example 26, further comprising pipelining the one or more subsequent kernels for processing at the GPU upon satisfaction of the one or more dependency events without having to stall the GPU.

Example 28 includes the subject matter of Example 23, wherein the resource threads comprise one or more of GPU hardware threads, command buffers, executable code, and memory heaps.

Example 29 includes the subject matter of Example 23, wherein the command buffer comprises a plurality of commands associated with the plurality of workloads, wherein the commands include one or more processing commands relating to the plurality of workloads and further include data having status data relating to the plurality of workloads, wherein the processing commands and the data are dispatched in pipeline to the GPU.

Example 30 includes the subject matter of Example 24, wherein the one or more dependency events include at least one of incompletion of processing of a base command associated with the base kernel, and unavailability of one or more of the resource threads, wherein the one or more subsequent kernels are associated with one or more subsequent commands depending from the base command.

Some embodiments pertain to Example 31 includes an apparatus comprising: means for generating a command buffer having a plurality of kernels relating to a plurality of workloads to be executed at a graphics processing unit (GPU); and means for pipelining the workloads to be processed at the GPU, wherein pipelining includes scheduling each kernel to be executed on the GPU based on at least one of availability of resource threads and status of one or more dependency events relating to each kernel in relation to other kernels of the plurality of kernels.

Example 32 includes the subject matter of Example 31, further comprising means for determining the status of the one or more dependency events, wherein the status indicates whether the one or more dependency events remain unresolved, wherein a dependency event includes a contingency event relating to a base kernel of the plurality of kernels such that the base kernel is to be executed, at least partially, to resolve the contingency event and initiate execution of one or more subsequent kernels of the plurality of kernels.

Example 33 includes the subject matter of Example 32, further comprising means for determining the availability of resource threads based on the one or more dependency events, wherein determining the availabilities includes detecting one or more idle resource threads that remain unused due to the one or more dependency events remaining unresolved.

Example 34 includes the subject matter of Example 31, further comprising means for acquiring the one or more idle resource threads, and pipeline one or more non-dependency kernels of the plurality of kernels for processing on the one or more idle resource threads without having to delay the processing or stall the GPU while the one or more subsequent kernels await satisfaction of the one or more dependency events.

Example 35 includes the subject matter of Example 34, further comprising means for pipelining the one or more subsequent kernels for processing at the GPU upon satisfaction of the one or more dependency events without having to stall the GPU.

Example 36 includes the subject matter of Example 31, wherein the resource threads comprise one or more of GPU hardware threads, command buffers, executable code, and memory heaps.

Example 37 includes the subject matter of Example 31, wherein the command buffer comprises a plurality of commands associated with the plurality of workloads, wherein the commands include one or more processing commands relating to the plurality of workloads and further include data having status data relating to the plurality of workloads, wherein the processing commands and the data are dispatched in pipeline to the GPU.

Example 38 includes the subject matter of Example 32, wherein the one or more dependency events include at least one of incompletion of processing of a base command associated with the base kernel, and unavailability of one or more of the resource threads, wherein the one or more subsequent kernels are associated with one or more subsequent commands depending from the base command.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. An apparatus comprising:
a processing device coupled to memory, wherein the processing device facilitates:
coalescing kernels logic to generate a command buffer having a plurality of kernels relating to a plurality of workloads to be processed by a graphics processor;
dependency checking logic to check, in runtime, availability of resource threads of the graphics processor that remain idle due to one or more pending dependency contingencies associated with one or more kernels of one or more workloads in relation to other kernels of the plurality of kernels of the command buffer; and
state management logic to acquire, in runtime, one or more idle resource threads to facilitate pipelining of other workloads in parallel execution based on the other kernels that do not have one or more pending dependency contingencies, wherein the other workloads are processed by the graphics processor using the one or more idle resource threads without having to stall the graphics processor for processing of the one or more workloads based on the one or more kernels and without seeking resolution of the one or more pending dependency contingencies associated with the one or more kernels, and
wherein the state management logic is further to set up interface descriptors for the plurality of kernels prior to processing the respective kernel and wherein the dependency checking logic checks availability, in part, by loading a descriptor by returning the data last written by the respective kernel, and wherein the state management logic pushes a write cycle in a pipelined workload based on a subsequent read as determined using a respective interface descriptor.

2. The apparatus of claim 1, wherein the processing device facilitates the dependency checking logic to determine status of one or more dependency events to determine, in runtime, whether a dependency event remains unresolved such that a base kernel is to be executed, at least partially, to resolve the one or more pending dependency contingencies to allow for initiation of execution of the one or more subsequent kernels of the plurality of kernels.

3. The apparatus of claim 2, wherein the processing device facilitates data coherency management logic to detect the one or more idle resource threads of the resource threads, wherein the one or more idle resource threads remain unused due to the one or more dependency events that remain unresolved.

4. The apparatus of claim 2, wherein the one or more dependency events include at least one of incompletion of processing of a base command associated with the base kernel, and unavailability of the one or more idle resource threads, wherein one or more subsequent kernels are associated with one or more subsequent commands depending from the base command.

5. The apparatus of claim 1, wherein the resource threads comprise one or more of graphics processor hardware threads, command buffers, executable code, and memory heaps.

6. The apparatus of claim 5, wherein a command buffer comprises a plurality of commands associated with the plurality of workloads, wherein the plurality of commands include one or more processing commands relating to the plurality of workloads and further include data having status data relating to the plurality of workloads, wherein the processing commands and the data are dispatched to the graphics processor using a pipeline.

7. The apparatus of claim 1, wherein the coalescing kernels logic, upon receiving an indication of one or more pending dependency contingencies associated with one or more kernels of one or more workloads, generates an additional command buffer having a first group of the plurality of kernels and the command buffer having a second group of the plurality of kernels with these command buffers to be submitted to pipelines for processing by the graphics processor while overcoming the one or more dependency contingencies.

8. A method comprising:
generating a command buffer having a plurality of kernels relating to a plurality of workloads to be processed by a graphics processor;
setting up interface descriptors for the plurality of kernels prior to processing the respective kernels;
checking, in runtime, availability of resource threads that remain idle due to one or more pending dependency contingencies associated with one or more kernels of one or more workloads in relation to other kernels of the plurality of kernels of the command buffer, wherein the availability is checked, in part, by loading a descriptor by returning the data last written by the respective kernel; and
acquiring, in runtime, one or more idle resource threads based on the availability of resource threads to facilitate pipelining of other workloads in parallel execution based on the other kernels that do not have one or more pending dependency contingencies, wherein the other workloads are processed by the graphics processor using the one or more idle resource threads without having to stall the graphics processor for processing of the one or more workloads based on the one or more kernels and without seeking resolution of the one or more pending dependency contingencies associated with the one or more kernels, and wherein a write cycle is pushed in a pipelined workload based on a subsequent read as determined using a respective interface descriptor.

9. The method of claim 8, further comprising determining status of one or more dependency events to determine, in runtime, whether a dependency event remains unresolved such that a base kernel is to be executed, at least partially, to resolve the one or more pending dependency contingencies to allow for initiation of execution of the one or more subsequent kernels of the plurality of kernels.

10. The method of claim 9, further comprising detecting the one or more idle resource threads of the resource threads, wherein the one or more idle resource threads that remain unused due to the one or more dependency events that remain unresolved.

11. The method of claim 9, wherein the one or more dependency events include at least one of incompletion of processing of a base command associated with the base kernel, and unavailability of the one or more idle resource threads, wherein one or more subsequent kernels are associated with one or more subsequent commands depending from the base command.

12. The method of claim 8, wherein the resource threads comprise one or more of graphics processor hardware threads, command buffers, executable code, and memory heaps.

13. The method of claim 12, wherein a command buffer comprises a plurality of commands associated with the plurality of workloads, wherein the plurality of commands include one or more processing commands relating to the plurality of workloads and further include data having status data relating to the plurality of workloads, wherein the processing commands and the data are dispatched to the graphics processor using a pipeline to the graphics processor.

14. At least one non-transitory machine-readable medium comprising a plurality of instructions, executed on a computing device, to facilitate the computing device to perform one or more operations comprising:

generating a command buffer having a plurality of kernels relating to a plurality of workloads to be processed by a graphics processor;

setting up interface descriptors for the plurality of kernels prior to processing the respective kernels;

checking, in runtime, availability of resource threads that remain idle due to one or more pending dependency contingencies associated with one or more kernels of one or more workloads in relation to other kernels of the plurality of kernels of the command buffer, wherein the availability is checked, in part, by loading a descriptor by returning the data last written by the respective kernel; and acquiring, in runtime, one or more idle resource threads based on the availability of resource threads to facilitate pipelining of other workloads in parallel execution based on the other kernels that do not have one or more pending dependency contingencies, wherein the other workloads are processed by the graphics processor using the one or more idle resource threads without having to stall the graphics processor for processing of the one or more workloads based on the one or more kernels and without seeking resolution of the one or more pending dependency contingencies associated with the one or more kernels, and wherein a write cycle is pushed in a pipelined workload based on a subsequent read as determined using a respective interface descriptor.

15. The non-transitory machine-readable medium of claim 14, wherein the one or more operations further comprise determining status of one or more dependency events to determine, in runtimes whether a dependency event remains unresolved such that a base kernel is to be executed, at least partially, to resolve the one or more pending dependency contingencies to allow for initiation of execution of the one or more subsequent kernels of the plurality of kernels.

16. The non-transitory machine-readable medium of claim 15, wherein the one or more operations further comprise detecting the one or more idle resource threads of the resource threads, wherein the one or more idle resource threads that remain unused due to the one or more dependency events that remain unresolved.

17. The non-transitory machine-readable medium of claim 15, wherein the one or more dependency events include at least one of incompletion of processing of a base command associated with the base kernel, and unavailability of the one or more idle resource threads, wherein one or more subsequent kernels are associated with one or more subsequent commands depending from the base command.

18. The non-transitory machine-readable medium of claim 14, wherein the resource threads comprise one or more of graphics processor hardware threads, command buffers, executable code, and memory heaps.

19. The non-transitory machine-readable medium of claim 18, wherein a command buffer comprises a plurality of commands associated with the plurality of workloads, wherein the plurality of commands include one or more processing commands relating to the plurality of workloads and further include data having status data relating to the plurality of workloads, wherein the processing commands and the data are dispatched to the graphics processor using a pipeline to the graphics processor.

* * * * *